(12) United States Patent
Jiang et al.

(10) Patent No.: US 12,550,668 B2
(45) Date of Patent: Feb. 10, 2026

(54) SUBSTRATE TRANSFER DEVICE AND POWER SUPPLY METHOD FOR SUBSTRATE TRANSFER DEVICE

(71) Applicant: Tokyo Electron Limited, Tokyo (JP)

(72) Inventors: Lingxin Jiang, Yamanashi (JP); Tsukasa Chida, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/885,568

(22) Filed: Sep. 14, 2024

(65) Prior Publication Data

US 2025/0112072 A1    Apr. 3, 2025

(30) Foreign Application Priority Data

Sep. 28, 2023    (JP) .................. 2023-168748

(51) Int. Cl.
*H01L 21/677* (2006.01)
*H02J 50/10* (2016.01)
*H02J 50/40* (2016.01)

(52) U.S. Cl.
CPC ........ *H01L 21/67709* (2013.01); *H02J 50/10* (2016.02); *H02J 50/40* (2016.02)

(58) Field of Classification Search
CPC .............. H01L 21/677; H01L 21/67709; H02J 50/10; H02J 50/40
See application file for complete search history.

(56) References Cited

U.S. PATENT DOCUMENTS

| | | | |
|---|---|---|---|
| 9,202,719 B2 | 12/2015 | Lu et al. | |
| 2014/0285122 A1 | 9/2014 | Lu et al. | |
| 2023/0317488 A1 | 10/2023 | Sakaue | |

FOREIGN PATENT DOCUMENTS

| | | |
|---|---|---|
| JP | 2014-531189 A | 11/2014 |
| JP | 2022-036757 A | 3/2022 |
| WO | WO 2013/059934 A1 | 5/2013 |

*Primary Examiner* — Robert L Deberadinis
(74) *Attorney, Agent, or Firm* — Fenwick & West LLP

(57) ABSTRACT

Provided is a substrate transfer device comprising: a tile part forming a moving surface of an area where a substrate is transferred and provided with a plurality of first coils that generate magnetic field on the moving surface by a power supplied from a power supply part; and a substrate transfer module including a plurality of magnets that exert a repulsive force against the magnetic field and a substrate holder configured to hold a substrate to be transferred, the substrate transfer module configured to move above the moving surface by magnetic levitation using the repulsive force, wherein the substrate transfer module includes a second coil for wirelessly supplying a power to a power consuming device provided in the substrate transfer module during movement above the moving surface using an electromotive force that is exerted against the magnetic field generated by the first coils.

14 Claims, 21 Drawing Sheets

SUBSTRATE TRANSFER DEVICE AND POWER SUPPLY METHOD FOR SUBSTRATE TRANSFER DEVICE

CROSS-REFERENCE TO RELATED APPLICATIONS

This application claims priority to Japanese Patent Application No. 2023-168748 filed on Sep. 28, 2023, the entire contents of which are incorporated herein by reference.

TECHNICAL FIELD

The present disclosure relates to a substrate transfer device and a power supply method for the substrate transfer device.

BACKGROUND

For example, in an apparatus (substrate processing apparatus) for performing processing on a semiconductor wafer (hereinafter also referred to as "wafer") that is a substrate, the wafer is transferred between a carrier containing the wafer and a substrate processing chamber in which processing is performed. The wafer is transferred using substrate transfer mechanisms of various configurations.

The applicant is developing a substrate processing apparatus for transferring a substrate by a substrate transfer module using magnetic levitation.

Japanese Laid-open Patent Publication No. 2022-36757 discloses, as an apparatus using magnetic levitation, a configuration in which a substrate is magnetically levitated using a repulsive force between a first magnet disposed at a bottom portion of a substrate transfer chamber and a second magnet disposed at a substrate transfer module. The second magnet is an electromagnet to which a power is supplied by a battery disposed at the substrate transfer module, and a control signal related to power supply control can be obtained by wireless communication. However, a specific configuration related to the power supply control is not described.

In addition, Japanese Laid-open Patent Publication No. 2014-531189 discloses a technique related to arrangement of a magnet array in a displacement device that includes a stator with a coil and a movable stage with a magnet array, and moves the stator and the movable stage relative to each other.

SUMMARY

The present disclosure provides a technique for wirelessly supplying a power to a power consuming device disposed in a substrate transfer module for transferring a substrate using magnetic levitation in a substrate transfer device.

In accordance with an aspect of the present disclosure, there is provided a substrate transfer device comprising: a tile part forming a moving surface of an area where a substrate is transferred and provided with a plurality of first coils that generate magnetic field on the moving surface by a power supplied from a power supply part; and a substrate transfer module including a plurality of magnets that exert a repulsive force against the magnetic field and a substrate holder configured to hold a substrate to be transferred, the substrate transfer module configured to move above the moving surface by magnetic levitation using the repulsive force, wherein the substrate transfer module includes a second coil for wirelessly supplying a power to a power consuming device provided in the substrate transfer module during movement above the moving surface using an electromotive force that is exerted against the magnetic field generated by the first coils.

DETAILED DESCRIPTION

<Substrate Processing System>

Hereinafter, an example of a configuration of a substrate processing system 1 that is an apparatus for transferring a substrate according to an embodiment of the present disclosure will be described with reference to FIG. 1.

Figure 1:
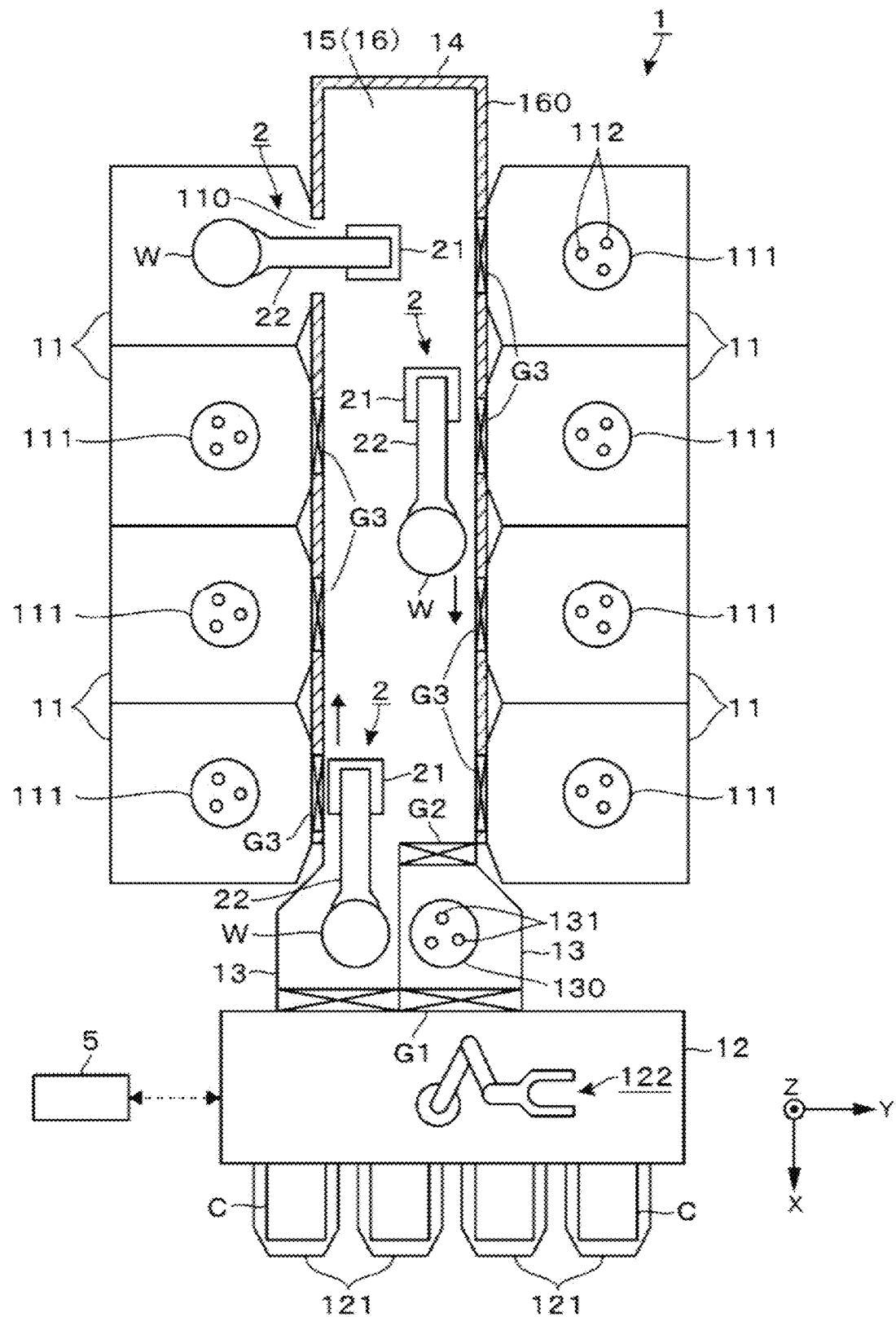
FIG. 1 is a plan view showing an example of a configuration of a substrate processing system.

FIG. 1 illustrates a multi-chamber type substrate processing system 1 including a plurality of substrate processing chambers 11 for processing wafers W. As shown in FIG. 1, in the substrate processing system 1, an atmospheric transfer chamber 12, load-lock chambers 13, and a substrate transfer chamber 14 are arranged along a front-rear direction. Further, the plurality of substrate processing chambers 11 are arranged in a left-right direction of the substrate transfer chamber 14. Hereinafter, in the substrate processing system 1, the front-rear direction is referred to as "X direction," the left-right direction horizontally intersecting with the front-rear direction is referred to as "Y direction," and in the front-rear direction, the side where the atmospheric transfer chamber 12 is located will be referred to as "front side" and the side where the substrate transfer chamber 14 is located will be referred to as "rear side.

Load ports 121 on which carriers C accommodating wafers W to be processed are placed are disposed at the front side of the atmospheric transfer chamber 12. The carrier C may be, e.g., a front opening unified pod (FOUP). The atmospheric transfer chamber 12 is maintained at an atmospheric pressure (normal pressure), and a transfer mechanism 122 is disposed therein to transfer the wafer W between the carrier C and the load-lock chambers 13.

An inner atmosphere of the load-lock chamber 13 can be switched between an atmospheric pressure atmosphere and a vacuum atmosphere, and a transfer stage 130 on which the wafer W is placed and lift pins 131 are provided in the load-lock chamber 13.

As shown in FIG. 1, the substrate transfer chamber 14 is configured as a rectangular housing in plan view that is elongated in the front-rear direction, and a tile part 16 forming a moving surface 15 of the area where the wafer W is transferred is disposed in the substrate transfer chamber 14. The tile part 16 is installed on the entire bottom surface of the substrate transfer chamber 14, and the moving surface 15 constitutes the bottom surface of the substrate transfer chamber 14. In this example, the substrate processing chamber 11 is configured to process the wafer W in a vacuum atmosphere, and the substrate transfer chamber 14 is depressurized to a vacuum atmosphere by a vacuum exhaust mechanism (not shown).

For example, four substrate processing chambers 11 are connected to each of the left side and the right side of the substrate transfer chamber 14, and openings 110 for transferring wafers W to the substrate processing chambers 11 are formed between the substrate transfer chamber 14 and the substrate processing chambers 11. In FIG. 1, notations G1, G2, and G3 indicate gate valves for opening and closing transfer openings for the wafer W, such as the openings 110.

Further, substrate transfer modules (hereinafter, referred to as "transfer modules") 2 for transferring the wafers W between the load-lock chambers 13 and the substrate processing chambers 11 are disposed in the substrate transfer chamber 14.

For example, the substrate transfer chamber 14 has a short side length that allows two transfer modules 2 arranged in the left-right direction and holding the wafers W to pass each other without interference. In the substrate transfer chamber 14, the wafers W are transferred using the plurality of transfer modules 2. In this example, a plurality of first coils 3 are disposed at the tile part 16 forming the moving surface 15, and the transfer module 2 is configured to move by utilizing magnetic levitation using the repulsive force against the first coils 3. The specific configurations of the first coils 3 and the transfer module 2 will be described later.

Each substrate processing chamber 11 is depressurized to a vacuum atmosphere by a vacuum exhaust mechanism (not shown). A placing table 111 and lift pins 112 are disposed in each substrate processing chamber 11, and predetermined processing is performed on the wafer W placed on the placing table 111. The lift pins 112 and 131 are configured to lift up and hold the wafer W, and transfer the wafer W. The processing performed on the wafer W may be etching, film formation, cleaning, ashing, or the like.

<Controller>

The substrate processing system 1 includes a controller 5. The controller 5 is a computer having a central processing unit (CPU) and a storage part, and controls individual components of the substrate processing system 1. The storage part records a program having steps (commands) for controlling the operation of the substrate processing chamber 11. The program is stored in a storage medium such as a hard disk, a compact disk, a magneto-optical disk, a memory card, or a non-volatile memory, and is installed in the computer therefrom. The storage part also stores a program for moving the transfer module 2 or performing power supply. The controller 5 constitutes a power supply controller 501 to be described later, and is configured to control the function related to the movement of the transfer module 2 or the wireless power supply.

An example of transfer of the wafer W in the substrate processing system 1 will be briefly described. The wafer W in the carrier C placed on the load port 121 is transferred to the load-lock chamber 13 maintained in an atmospheric pressure atmosphere by the transfer mechanism 122. Next, the inner atmosphere of the load-lock chamber 13 is switched from an atmospheric pressure atmosphere to a vacuum atmosphere and, then, the wafer W in the load-lock chamber 13 is transferred to the substrate processing chamber 11 for processing the wafer W by the transfer module 2.

In the substrate processing chamber 11, the wafer W placed on the placement table 111 is heated to a preset temperature, if necessary, and a processing gas is supplied into the substrate processing chamber 11 when a processing gas supply part is provided. Accordingly, desired processing is performed on the wafer W.

After the wafer W is processed, the wafer W is transferred in a reverse order of the loading process, and is returned from the substrate processing chamber 11 to the load-lock chamber 13. Further, after the inner atmosphere of the load-lock chamber 13 is switched to an atmospheric pressure atmosphere, the wafer W is returned to a predetermined carrier C by the transfer mechanism 122.

<Substrate Transfer Module>

In the substrate processing system 1 having the above-described schematic configuration, the transfer module 2 is configured to be movable in the substrate transfer chamber 14 by magnetic levitation. The transfer module 2 has a function of not only transferring the wafer W but also wirelessly supplying a power to a power consuming device disposed in the transfer module 2. Hereinafter, the configuration of devices related to the transfer of the wafer W using the transfer module 2 and the wireless power supply will be described.

Figure 2A:
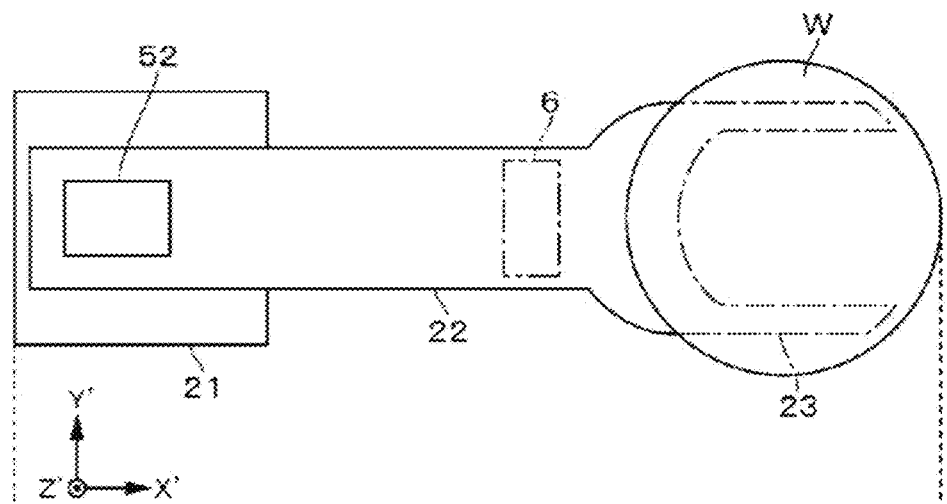
FIGS. 2A to 2C are a plan view, a side view, and a bottom view showing an example of a configuration of a substrate transfer module, respectively.
Figure 2B:
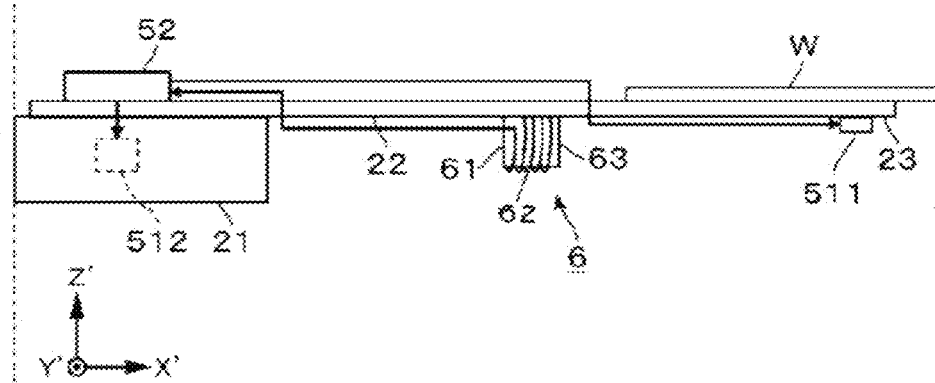
Figure 2C:
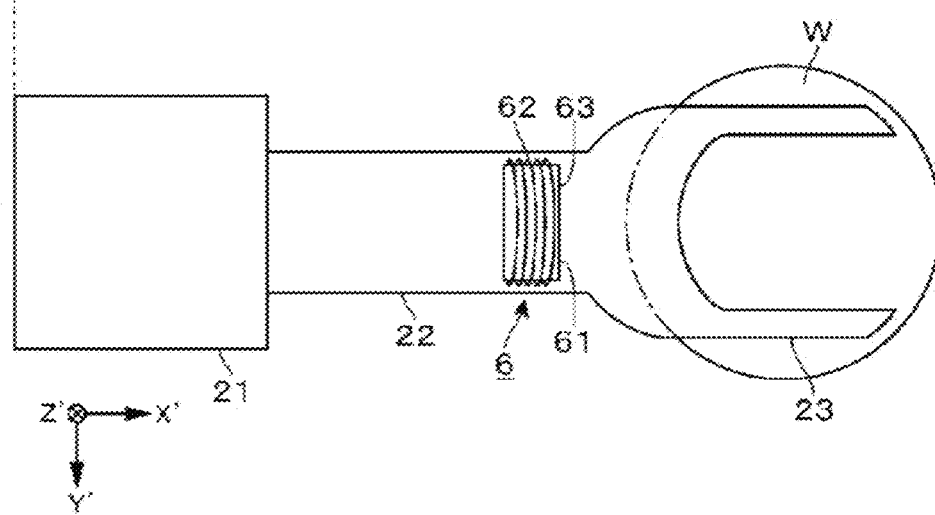

FIGS. 2A to 2C shows a plan view, a side view, and a bottom view of the transfer module 2, respectively.

As shown in FIGS. 2A to 2C, the transfer module 2 includes a main body 21 and a fork 22 extending from the main body 21 in a direction (horizontal direction) along the moving surface 15. Further, a substrate holder 23 for holding the wafer W to be transferred horizontally is formed at the tip end of the fork 22. The substrate holder 23 is configured to surround three lift pins 131 and 112 disposed in the load-lock chamber 13 or the substrate processing chamber 11 from the sides thereof, for example.

Figure 3:
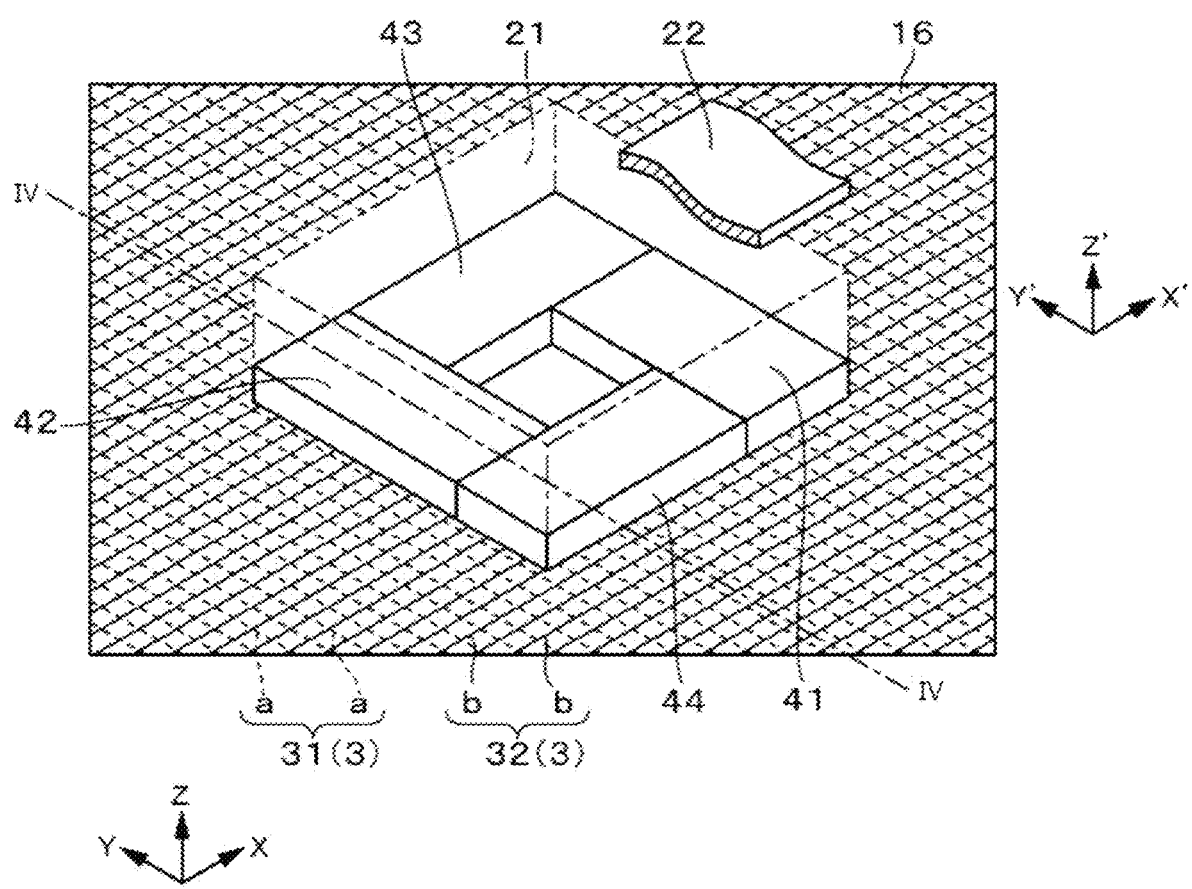
FIG. 3 is a perspective view showing an example of a configuration of a main body of a substrate transfer module and a first coil disposed at a tile part.

The fork 22 has a length that allows the wafer W to be transferred to the placing table 111 by inserting it into the substrate processing chamber 11 through the opening 110 where the gate valve G3 is opened in a state where the main body 21 is positioned in the substrate transfer chamber 14. As shown in FIGS. 2 and 3, the transfer module 2 will be described using a coordinate system (X', Y', Z') set for the corresponding module 2. In this coordinate system, the protruding direction of the fork 22 is set as the front-rear direction (X' direction), and the tip end side of the fork 22 in the front-rear direction is set as the front side. Further, the direction intersecting with the front-rear direction horizontally is set as the left-right direction (Y' direction).

The main body 21 is provided with magnets 4 (see FIG. 3) that exerts the repulsive force against the magnetic field generated at the tile part 16 to be described later. Further, the transfer module 2 is provided with a power consuming device, such as a sensor 51. The sensor 51 may be, e.g., a position sensor, an acceleration sensor, an inclination sensor, a temperature sensor, or the like. In this example, as shown in FIGS. 2B and 2C, a position sensor 511 is disposed on the bottom surface of the tip end side of the substrate holder 23, and an inclination sensor 512 is disposed in the main body 21.

Further, a second coil 6 for wirelessly supplying a power to the sensor 51 is disposed at a position close to the substrate holder 23 on the bottom surface side of the fork 22, for example. In this manner, the second coil 6 and the magnets 4 are arranged at positions where they do not overlap each other when viewed from the moving surface 15. Further, as shown in FIG. 2B, in the transfer module 2, a battery 52 is disposed on the upper surface of the main body 21, for example. The battery 52 stores the power supplied through the second coil 6 and supplies it to the sensor 51. The second coil 6 and the battery 52, and the battery 52 and the sensor 51 are electrically connected. Since the battery 52 in this example stores the power for the sensor 51, and thus may be a small and lightweight battery having a small capacity. For example, the battery 52 may have a capacity of 1000 mAh and a weight of about 20 to 25 g on the assumption that the power consumption of the sensor 51 is about 3 W.

<Tile Part>

Next, the tile part 16 constituting the moving surface 15 of the substrate transfer chamber 14 will be described with reference to FIGS. 3, 4 and 5. As schematically shown in FIG. 5, the bottom surface (the moving surface 15) of the substrate transfer chamber 14 is formed by the tile part 16. Although FIG. 5 shows the tile part 16 on a part of the moving surface 15, the tile part 16 is actually installed on the entire bottom surface of the substrate transfer chamber 14.

Figure 8A:
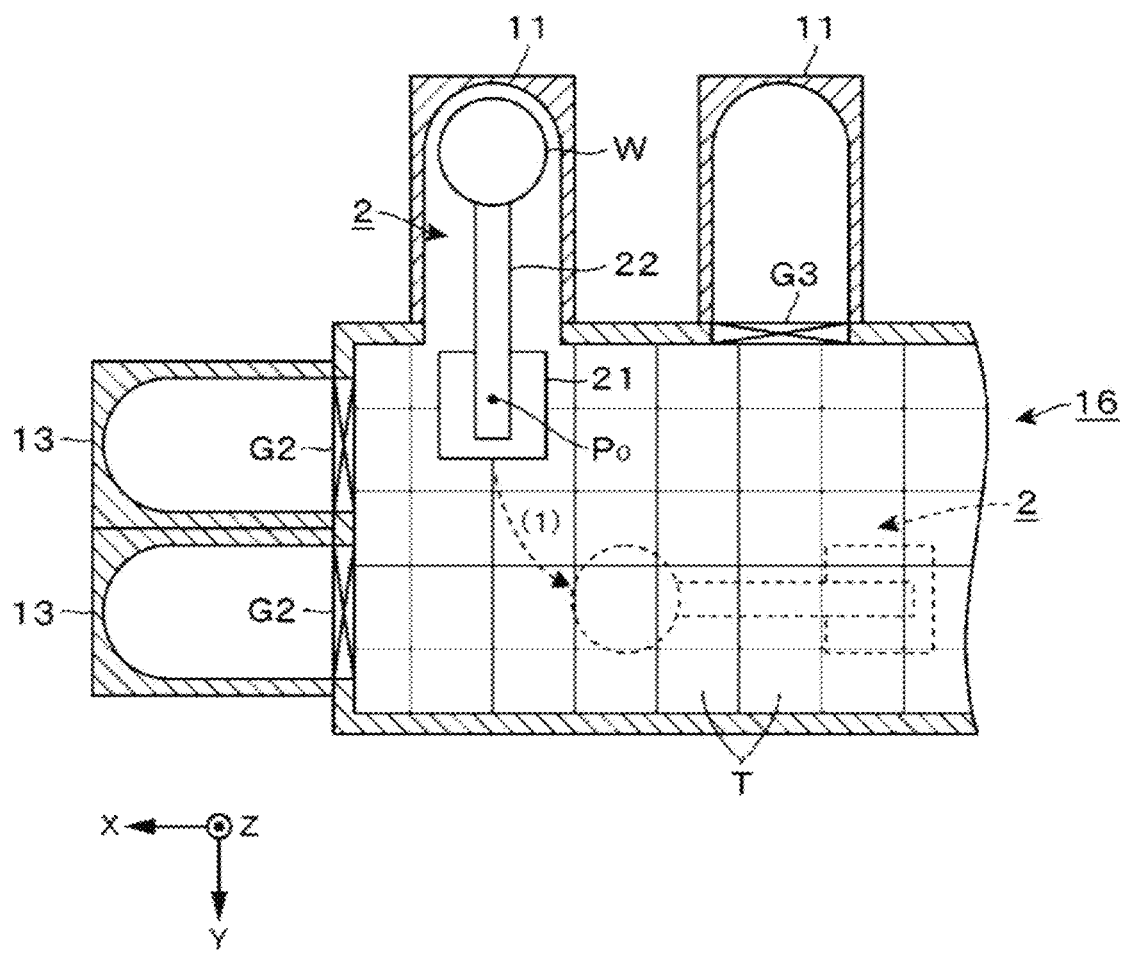
FIG. 8A is a first plan view showing an example of the operation of the substrate transfer module.
Figure 8B:
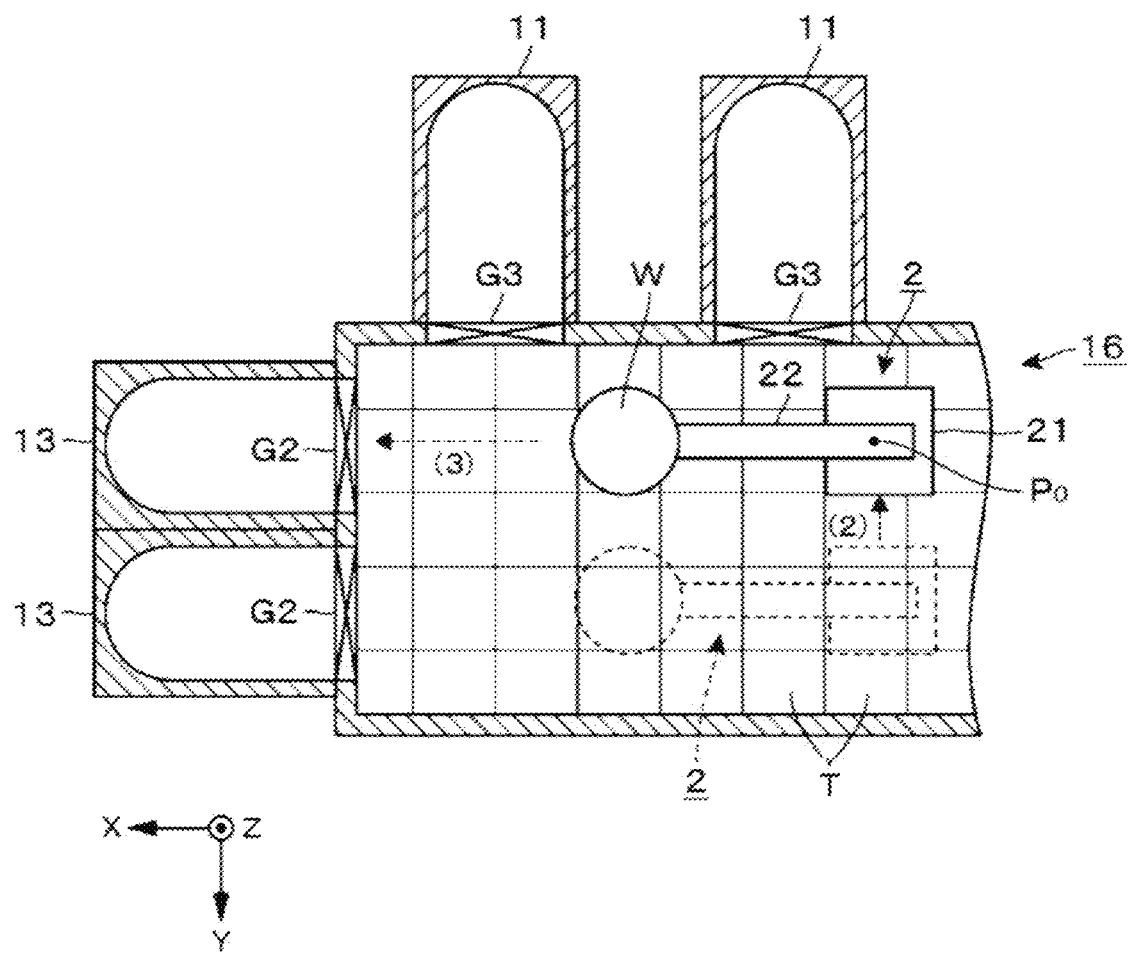
FIG. 8B is a second plan view showing an example of the operation of the substrate transfer module.

As shown in FIGS. 8A and 8B to be described later, the tile part 16 is formed by vertically and horizontally arranging multiple tile units T, each having a rectangular shape in plan view. Each tile unit T has therein multiple first coils 3. The first coils 3 generates magnetic field on the moving surface 15 by power supply from a power supply part 34 constituting a DC power supply part.

The first coil 3 will be described with reference to FIGS. 3 and 4. FIG. 4 is a vertical cross-sectional side view taken along line IV-IV in FIG. 3. As shown in FIGS. 3 and 4, the tile part 16 is provided with a plurality of first coils 3 arranged to extend in different directions along the moving surface 15 when viewed from a vertical axis intersecting the moving surface 15.

As described with reference to FIG. 1, in the substrate processing system 1, the X direction and the Y direction are set in a common horizontal plane. The first coils 3 in this example are arranged linearly to extend along the X direction set in the horizontal plane and the Y direction set in the horizontal plane and perpendicular to the X direction. Hereinafter, the first coil 3 extending along the Y direction may be referred to as "A coil 31" and the first coil 3 extending along the X direction may be referred to "B coil 32." In FIG. 3, for convenience of illustration, the A coil 31 is indicated by a dashed line, and the B coil 32 is indicated by a solid line. The setting of the X-Y directions is not limited to the setting in this example. If necessary, the X direction and the Y direction are rotated from the example shown in FIG. 1 in a clockwise direction by 45°, 90°, or 135° about the vertical axis, and the first coils 3 may be arranged to extend along those directions (see FIG. 18 to be described later).

The area in which the first coils 3 are installed is the entire moving area of the transfer module 2, which is from the transfer position (facing the load-lock chambers 13) of the wafer W with respect to the atmospheric transfer chamber 12 to the front side of the substrate processing chamber 11, and the surface of the moving area corresponds to the moving surface 15. If the moving area is set such that the transfer module 2 moves into the load-lock chambers 13 or the substrate processing chamber 11, the first coils 3 are also disposed on the bottom surfaces of the load-lock chambers 13 or the substrate processing chamber 11. FIG. 3 shows a part of the moving area.

The plurality of A coils 31 are arranged at intervals in the X direction to extend along the Y direction. The plurality of B coils 32 are arranged at intervals in the Y direction to extend along the X direction. Each of the A coils 31 and the B coils 32 is formed of coil wires a and b.

Figure 4:
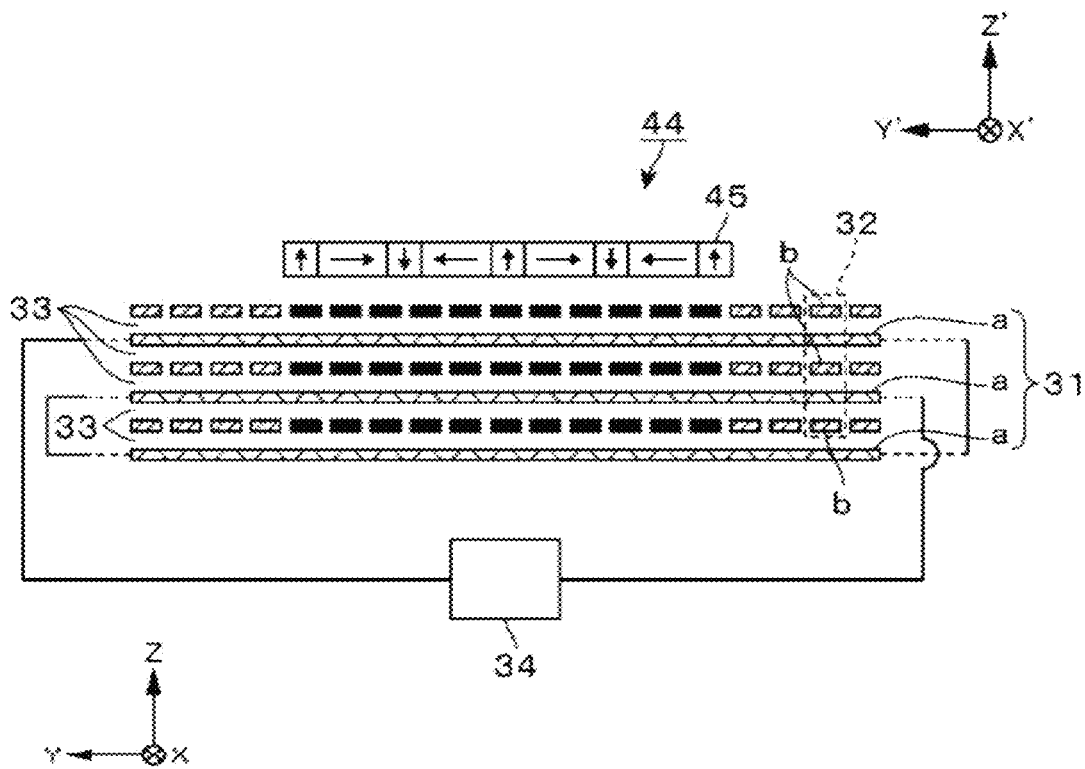
FIG. 4 is a longitudinal side view showing an example of a configuration of a magnet of the substrate transfer module and the first coil.
Figure 5:
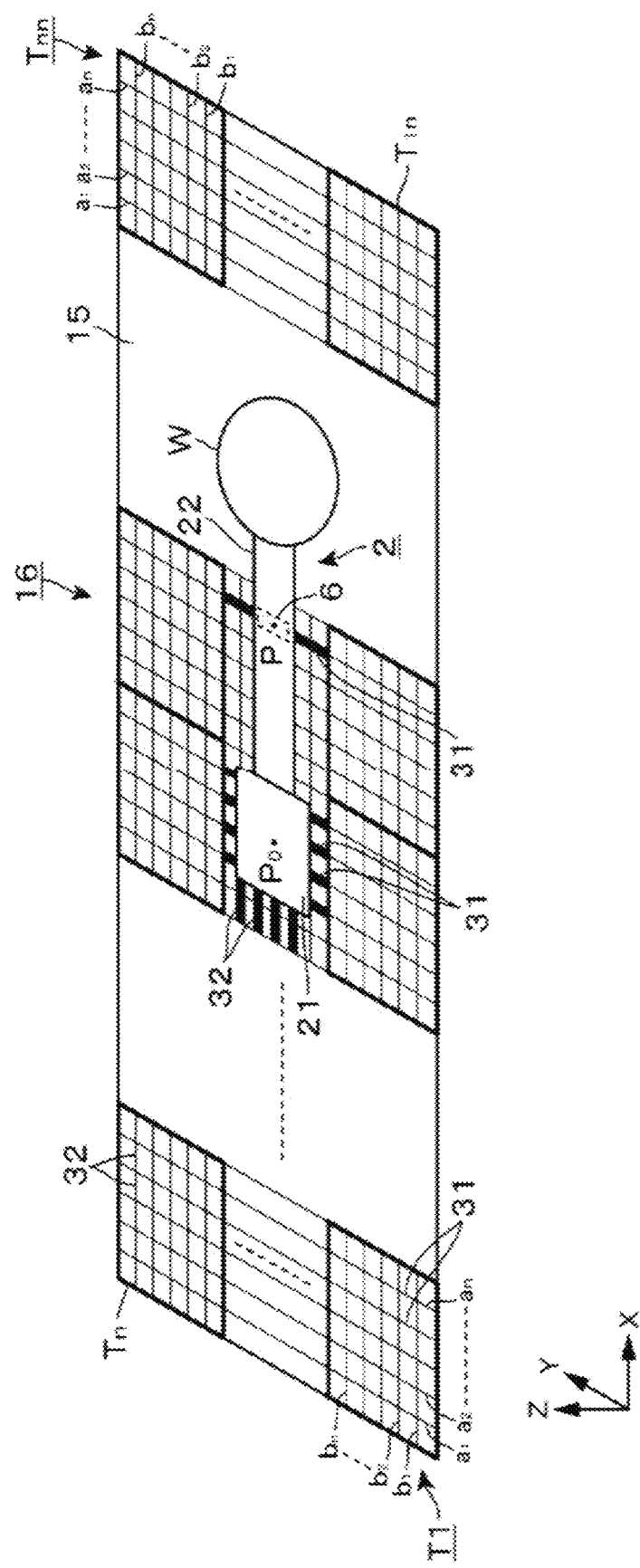
FIG. 5 is a perspective view showing an example of a schematic configuration of the substrate transfer module and the tile part.

As schematically shown in FIG. 4, the coil wires a and b forming the A coils 31 and B coils 32 are alternately stacked, for example, and the coil wires a and b that are vertically stacked insulated from each other by an insulating layer 33. The stacked structure of the coil wires a and b and the insulating layer 33 is formed of a printed circuit board, for example. The number of stacked coil wires a and b shown in FIG. 4 is an example, and may be property changed if necessary.

As shown in FIG. 4, each of the vertically stacked coil wires a is electrically connected, at one end or the other end thereof in the Y direction, to one end or the other end of the coil wire a disposed on the upper or lower layer side. When viewed in the Y-Z vertical cross section, the stacked coil wires a are connected in a spiral shape, for example, and both ends thereof are connected to the power supply part 34, thereby forming the A coil 31.

Similarly, each of the vertically stacked coil wires b is electrically connected, at one or the other end thereof in the X direction, to one end or the other end of the coil wire b disposed on the upper or lower layer side. When viewed in the X-Z vertical cross section, the stacked coil wires b are connected in a spiral shape, for example, and both ends thereof are connected to the power supply part 34, thereby forming the B coil 32. FIGS. 3 and 5 show the coil wires a and b of the uppermost layers in the A coil 31 and the B coil 32.

Figure 6:
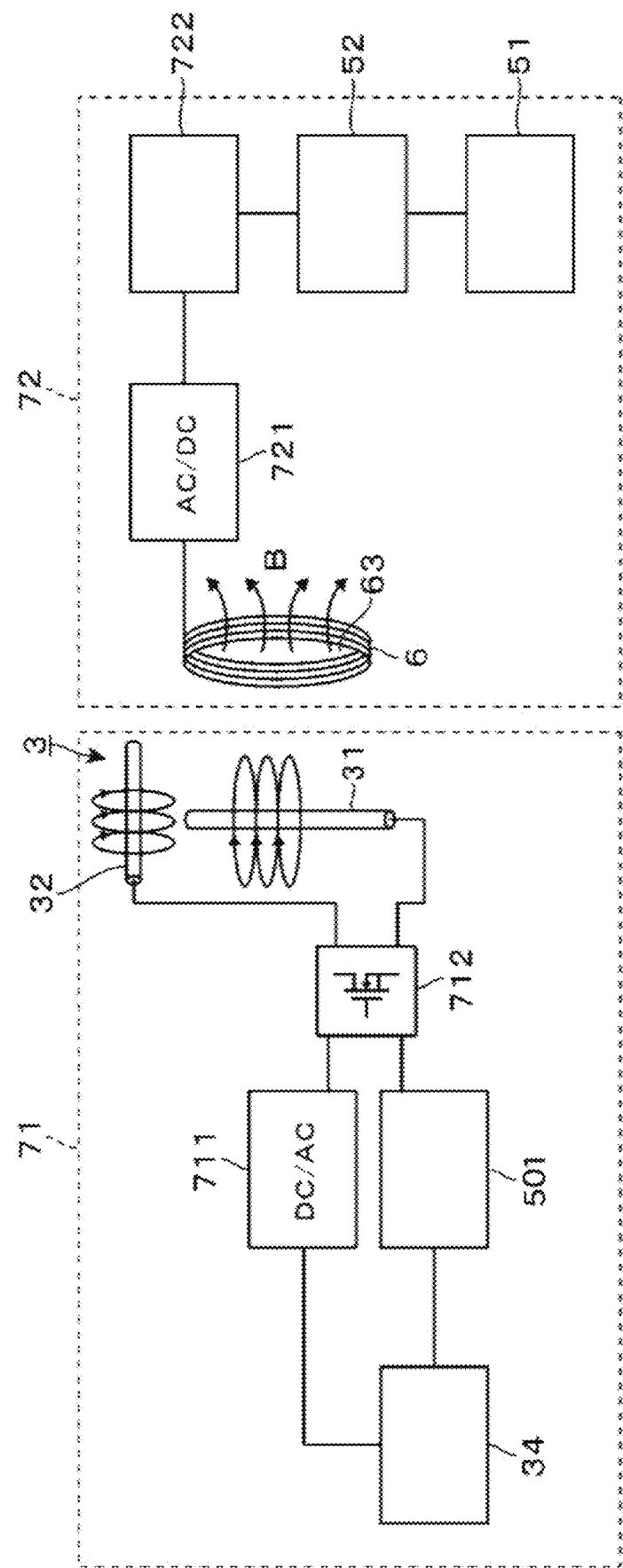
FIG. 6 is a block diagram showing an electrical configuration of a system that supplies a power wirelessly to a sensor disposed at the substrate transfer module.

The power supply part 34 is configured to supply a power to the selected A coil 31 and B coil 32 based on a command from the controller 5 (the power supply controller 501), and generate magnetic field on the upper surface of the tile part 16 in the area where the A coil 31 and B coil 32 to which the power has been supplied are arranged. For convenience of illustration, only the power supply part 34 corresponding to one A coil 31 is shown in FIG. 4. However, the substrate processing system 1 is provided with multiple power supply parts 34. Further, as shown in FIG. 6 to be described later, a switch element 712 is disposed between the power supply part 34 and the A coil 31 and B coil 32. Accordingly, a power can be supplied to the first coils 3 disposed at the tile part 16 in units of coil wires a and b, for example.

The A coils 31 and B coils 32 are arranged in the same manner in each of the tile parts T. By arranging each tile unit T on the bottom surface of the substrate transfer chamber 14, the A coil 31 and the B coil 32 disposed at the adjacent tile unit T are connected to each other, and the A coil 31 and the B coil 32 are arranged on the entire moving surface 15 that is the bottom surface.

As shown in FIG. 5, for example, the tile units T constituting the tile part 16 are assigned with addresses such as tile unit $T_1, \ldots, T_n, \ldots, T_{nn}$. The A coils 31 disposed at each tile unit T are also assigned with addresses such as $a_1, a_2, \ldots, a_n$. Similarly, the B coils 32 are also assigned with addresses such as $b_1, b_2, \ldots, b_n$. In this manner, the first coils 3 of each tile unit T are assigned with the common address. The controller 5 is configured to select the address of the tile unit T and the address of the first coil 3, and to supply a power to the A coil 31 and the B coil 32 of the selected addresses via the power supply part 34 and the switch element 712.

Next, the main body 21 of the transfer module 2 will be described. As shown in FIG. 3, the main body 21 is formed in a square shape in plan view, for example, and has therein multiple magnets 4 (41, 42, 43, and 44). The magnets 4 are configured to exert the repulsive force against the magnetic field generated by the first coils 3. The magnets 4 are formed in the same rectangular shape in plan view, for example, and are fitted into the square main body 21 to be arranged along four sides of the outer edge of the main body 21.

Each of the magnets 4 includes multiple, e.g., nine permanent magnets 45 arranged in a Halbach array. FIG. 4 schematically shows nine permanent magnets 45 of the magnet 44 as a representative example and their magnetization directions. As shown in FIG. 3, when the transfer module 2 is disposed such that the fork 22 faces toward the front side in the X' direction, the nine permanent magnets 45 of each of the magnets 43 and 44 are arranged side by side along the Y' direction, and the magnetization directions of the permanent magnets 45 are perpendicular to the X' direction. Similarly, the nine permanent magnets 45 of each of the magnets 41 and 42 are arranged side by side along the X' direction, and the magnetization directions of the permanent magnets 45 are perpendicular to the Y' direction.

In the transfer module 2 configured as described above, the A coil 31 and the B coil 32 located below the area where the magnets 4 (41, 42, 43 and 44) are arranged are selected to supply a power flowing in a predetermined direction. As a result, the repulsive force is generated between the magnetic field generated by the first coils 3 and the magnetic field of the magnets 4, and is used to move the main body 21. For example, in FIG. 3, if the power is supplied to the A coils 31, the main body 21 moves in the X direction, and if the power is supplied to the B coils 32, the main body 21 moves in the Y direction.

In this manner, in the A coils 31 and the B coils 32, the position where the magnetic field is generated, the magnitude of the magnetic force, and the direction of the magnetic field are adjusted. Further, by controlling the magnetic field, the levitation amount (levitation distance) of the main body 21 from the moving surface 15, the direction of the main body 21, and the moving direction of the main body 21 are adjusted. As a result, the main body 21 can have a desired position above the moving surface 15, and can move in a desired direction.

Further, the tile part 16 is provided with a plurality of Hall elements (position detection sensors) (not shown). The Hall element is an example of a magnetic sensor, and detects the position and the direction of the main body 21. The moving speed of the main body 21 can also be detected by the Hall elements.

In this manner, the transfer module 2 is configured to be freely movable in the X, Y, Z, and 0 directions in the substrate transfer chamber 14, and can move with a high degree of freedom in the substrate transfer chamber 14. Therefore, there is a demand for a mechanism capable of supplying a power to the sensor 51 attached to the transfer module 2 without affecting the transfer operation of the transfer module 2.

Here, the power can be supplied by wire or using a pre-charged large-capacity battery. In that case, however, the weight of the battery or the length of the cable may cause deterioration in the operating performance of the transfer module 2.

Further, the wireless power supply can be performed by stopping the transfer module at a preset power supply point and supplying a power, or by installing a power transmission part on the bottom surface of the substrate transfer chamber along the transfer path of the wafer W, or by transmitting a power by radiating radio waves of a microwave band from the power transmission part. However, in the case of stopping the transfer module, a throughput may deteriorate, and in the case of installing the power transmission part along the transfer path, the transfer path may be limited. Further, in a configuration in which a new power transmission part is installed on the bottom surface, the existing device needs to be expanded considerably. Further, in the case of using radio waves of the microwave band, when the radio waves are emitted in the substrate processing chamber, reflection occurs and a power cannot be supplied due to the effects of standing waves, so that stable power supply cannot be achieved.

Hence, the present disclosure focuses on the case of using the first coils 3 installed in the substrate transfer chamber 14 for wireless power supply on the transfer module 2 side.

(Second Coil of Transfer Module)

As described above, the transfer module 2 includes the second coil 6 for wireless power supply. The second coil 6 is formed by winding a coil wire 62 around a base 61 made of a magnetic material such as ferrite or the like. For example, in the example shown in FIG. 2, the base 61 is formed in a rectangular parallelepiped shape, and is disposed such that the longitudinal direction thereof intersects with the front-rear direction (X' direction) of the fork 22. The coil wire 62 is wound around the base 61 along the long side thereof. The second coil 6 thus formed has an opening surface 63 that opens in the X' direction. The base 61 has a short side (length in the X' direction) of 10 mm to 200 mm, a long side (length in the Y' direction) of 100 mm to 300 mm, a height (length in the Z' direction) of several mm, and a weight of 50 g to 100 g, for example. Further, when the transfer module 2 is not levitated with respect to the tile part 16, a gap is formed between the upper surface of the tile part 16 and the bottom surface of the second coil 6, for example.

FIG. 6 is a block diagram showing an electrical configuration of a system that wirelessly supplies a power to the transfer module 2 side. FIG. 6 shows the configurations of a power supply mechanism 71 on the tile part 16 side and a power receiving mechanism 72 on the transfer module 2 side.

The power supply mechanism 71 on the tile part 16 side includes the power supply part 34 that is a DC power supply part, a DC/AC conversion circuit 711, the power supply controller 501, the switch element 712, and the first coils 3 (the A coil 31 and the B coil 32).

The power supply controller 501 is configured to switch the power supply state from the power supply part 34, for each of the first coils 3 (31 and 32) disposed at the tile part 16, depending on the positions of the magnets 4 of the transfer module 2 moving above the moving surface 15 and the position of the second coil 6. A driving mode for moving the transfer module 2, a wireless power supply mode for supplying a power to the second coil 6, and a standby mode in which no power is supplied are set as the power supply state for the first coils 3.

In the driving mode, the DC power supplied from the power supply part 34 is supplied to the selected A coil 31 and B coil 32 via the switch element 712. In the wireless power supply mode, the DC power supplied from the power supply part 34 is converted to an AC power by the DC/AC conversion circuit 711, and is supplied to the selected A coil 31 or B coil 32 via the power supply controller 501 and the switch element 712.

No power is supplied from the power supply part 34 to the A coil 31 and the B coil 32 in the standby mode.

On the other hand, the power receiving mechanism 72 on the transfer module 2 side includes the second coil 6, an AC/DC conversion circuit 721, a voltage regulator 722, and the battery 52. The AC/DC conversion circuit 721 converts an AC power to a DC power, and the voltage regulator 722 adjusts the voltage of the DC power converted by the AC/DC conversion circuit 721. Accordingly, an AC electromotive force generated between the first coil 3 and the second coil 6 is converted to a DC power by the AC/DC conversion circuit 721, and the voltage is adjusted by the voltage regulator 722, and then is stored in the battery 52, as will be described later. Further, the power is supplied from the battery 52 to the sensors 51 (the position sensor 511 and the inclination sensor 512) so that the position of the substrate holder 23, the inclination of the main body 21, and the like are detected.

Figure 7A:
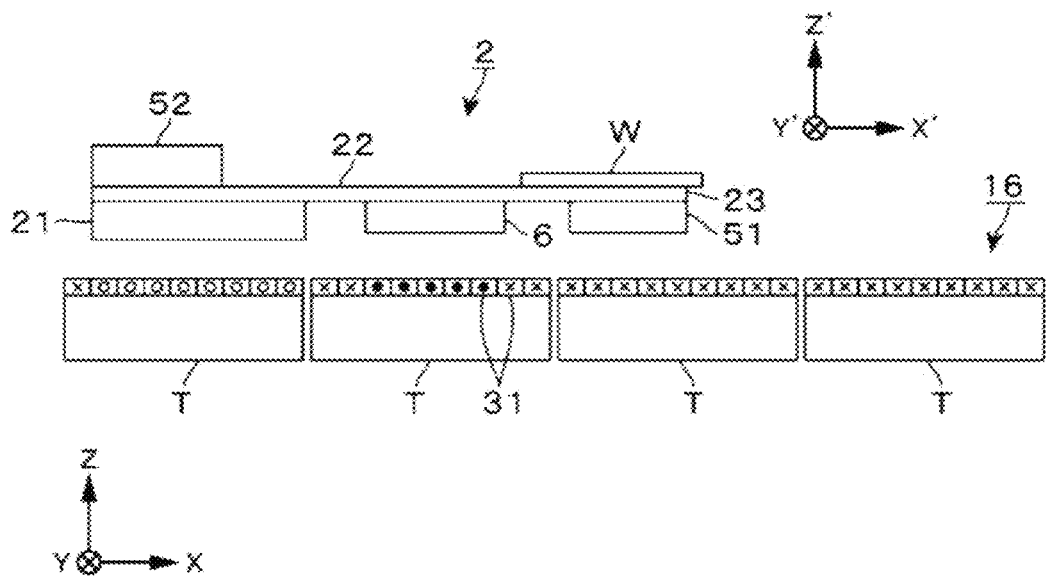
FIG. 7A is a first side view showing an operation of the first coil and the substrate transfer module.
Figure 7B:
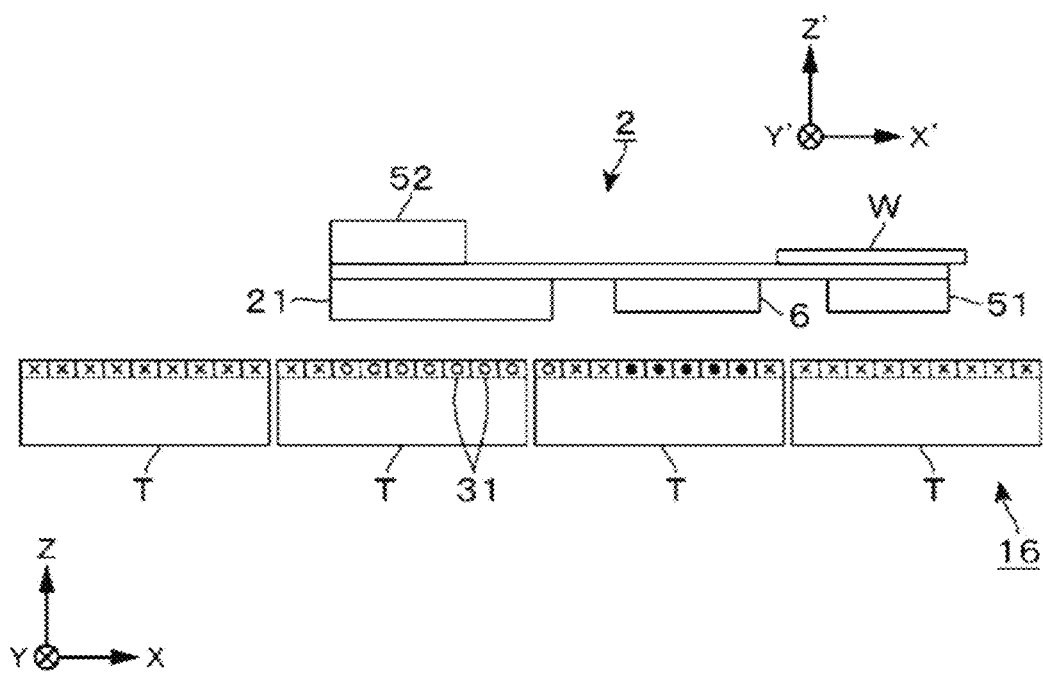
FIG. 7B is a second side view showing the operation of the first coil and the substrate transfer module.

Next, the control of the power supply state of the first coils 3 will be described with reference to FIGS. 5, 7A, and 7B. FIGS. 5, 7A and 7B show the state in which the transfer module 2 is disposed in the substrate transfer chamber 14 such that the fork 22 becomes parallel to the X direction and moves in the X direction. In FIG. 5, among the A coil 31 and the B coil 32 disposed at the tile part 16, the coils 31 and 32 whose power supply state is in the driving mode and the coil 31 whose power supply state is in the wireless power supply mode are indicated by thick solid lines, and the coils in the standby mode are shown by thin solid lines. Although FIG. 5 shows a part of the tile unit T of the tile part 16, the power supply state of any one of the driving mode, the wireless power supply mode, and the standby mode is assigned to all the coils 31 and 32 disposed at the tile part 16.

FIGS. 7A and 7B schematically show the power supply state of the A coil 31 when the transfer module 2 moves above the moving surface 15. In the power supply state, the driving mode is indicated by "○", the wireless power supply mode is indicated by "•", and the standby mode is indicated by "x". In this manner, the power supply state for each A coil 31 is set such that the A coil 31 in the lower area of the main body 21 is in the driving mode, the A coil 31 in the lower area of the second coil 6 is in the wireless power supply mode, and the other A coils 31 are in the standby mode. As the main body 21 moves, the power supply state for each A coil 31, that is, the positions of the coils 31 to be set to the driving mode, the wireless power supply mode, and the standby mode change.

As described above, in the main body 21, a position $P_0$ shown in FIG. 5 is recognized by the Hall element, for example, and the A coil 31 to be set to the driving mode is selected based on this position. For example, the position $P_0$ is the center position of the main body 21 in plan view. For example, the projection area of the main body 21 is recognized based on the position $P_0$, and the first coils 3 (31 and 32) in the area corresponding to the projection area is selected as the coil to be set to the driving mode.

In FIG. 5, for convenience of explanation, both the A coil 31 and the B coil 32 are set to the driving mode, but one or both of the A coil 31 and the B coil 32 are selected based on the moving direction of the transfer module 2. The area corresponding to the projection area may be larger or smaller than the actual projection area as long as the main body 21 can move in a desired direction by supplying a power to the first coils 3 (31 and 32) in the corresponding area.

A position P of the second coil 6 is calculated based on, e.g., coordinate information of the position $P_0$ of the main body 21. The position P of the second coil 6 shown in FIG. 5 is the center position of the opening surface 63, and is the center position of the base 61 of the second coil 6 in plan view, for example. Based on the position P, the projection area of the second coil 6 is recognized, and the first coils 3 (31 and 32) in the area corresponding to the projection area are selected as the coils to be set to the wireless power supply mode. The coil to be set to the wireless power supply mode is any one of the A coil 31 and the B coil 32 in this example, and is the A coil 31 in the example shown in FIGS. 5, 7A, and 7B.

As described above, an AC power is supplied to the first coils 3 set to the wireless power supply mode, and magnetic field is generated on the moving surface 15 by the first coils 3. Then, the magnetic field generated on the moving surface 15 changes due to the AC power supplied to the first coils 3, and an AC electromotive force acts between the first coils 3 and the second coil 6. As a result, an induced current is generated in the second coil 6, and the induced current is supplied to the AC/DC conversion circuit 721. The first coils 3 to be set to the wireless power supply mode may be one or more first coils 3 (the coil wires a and b) as long as an electromotive force can be generated between themselves and the second coil 6 by supplying a power to the first coils 3 in the corresponding area. Further, the first coils 3 in an area larger than the projection area of the second coil 6 may be set to the wireless power supply mode as long as the action of the first coils 3 set to the driving mode is not disturbed.

As the transfer module 2 moves, the power supply state of the first coils 3 disposed at the tile part 16 is controlled depending on the positions of the magnets 4 and the position of the second coil 6 and, thus, it is possible to wirelessly supply a power to the sensor 51 of the moving transfer module 2. On the other hand, the transfer operation of the wafer W by the transfer module 2 includes translational movement or rotational movement as shown in FIGS. 8A and 8B. FIGS. 8A and 8B show the operation of transferring the wafer W in the substrate processing chamber 11 to the load-lock chamber 13 by the transfer module 2.

First, as shown in FIG. 8A, the wafer W is transferred from the substrate processing chamber 11 to the substrate transfer chamber 14. As shown in (1), this transfer operation combines the rotational movement around the center position $P_0$ of the main body 21 and the translational movement in the X direction and the Y direction. Further, as shown in FIG. 8B, in the substrate transfer chamber 14, the main body 21 performs translational movement in the Y direction (2), and then performs translational movement in the X direction (3) to transfer the wafer W to the load-lock chamber 13. In this manner, the transfer module 2 transfers the wafer W by the combination of translational movement and rotational movement. In the case of translational movement, the moving speed changes in such a manner that it is accelerated at the start of the movement, and moves at a substantially constant speed, and is decelerated toward the end of the movement.

The magnitude of the electromotive force obtained between the first coils 3 and the second coil 6 of the tile part 16 is affected by the magnetic flux of the second coil 6. Since, however, the magnetic flux changes depending on the moving speed or the rotation angle of the transfer module 2, the electromotive force may vary depending on the transfer operation of the transfer module 2. On the other hand, in the present embodiment, a voltage regulator 722 is provided to adjust a voltage at the time of storing the electromotive force in the battery 52. An upper limit value of the inputted voltage of the DC power is set in the voltage regulator 722, so that it is preferable to suppress the variation in the electromotive force. Hence, in the present disclosure, the power supply controller 501 performs control to suppress the variation in the electromotive force during both translational movement and rotational movement.

<Constant Electromotive Force During Translational Movement>

Figure 9:
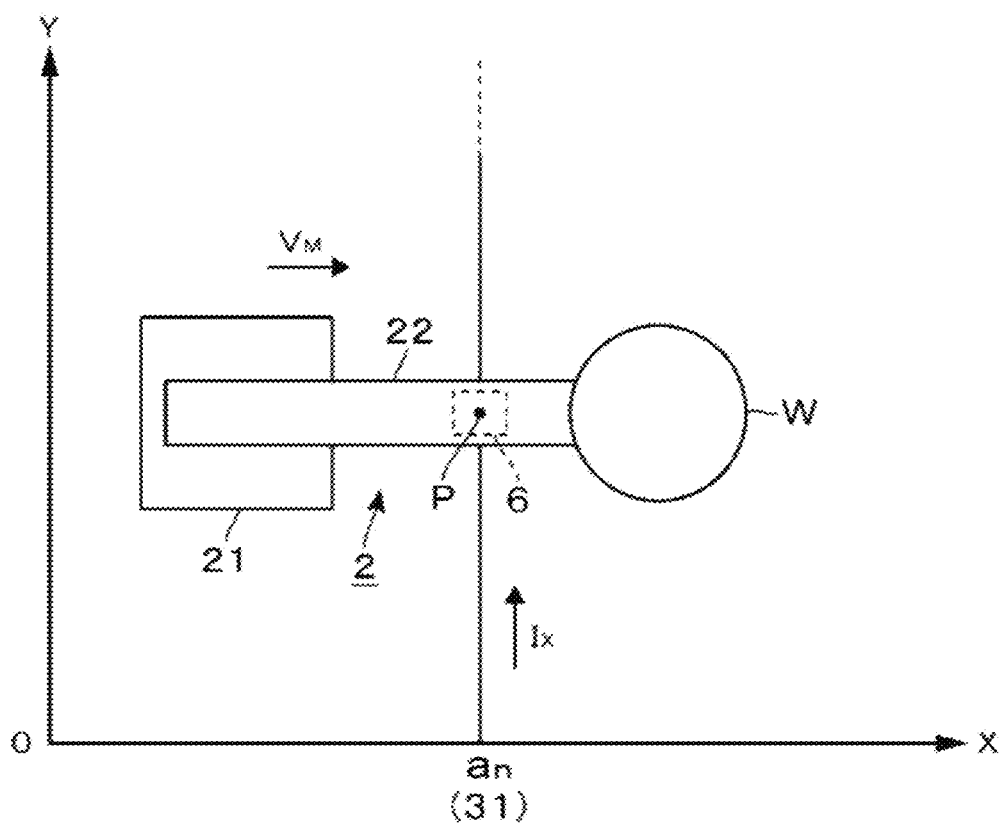
FIG. 9 is a plan view showing an example of the operation of the substrate transfer module.

FIG. 9 schematically shows a state in which the fork 22 of the transfer module 2 is disposed in parallel to the X direction, and the main body 21 performs translational movement in the X direction at a moving speed of $V_M$ (m/s). In FIG. 9, the horizontal axis represents the X direction, the vertical axis represents the Y direction, and $a_n$ represents the coil wire of the uppermost layer of the A coil 31 directly below the position P of the second coil 6. Hereinafter, the A coil 31 may also be referred to as "A coil $a_n$," and the B coil 32 may also be referred to as "B coil $b_n$."

Figure 10A:
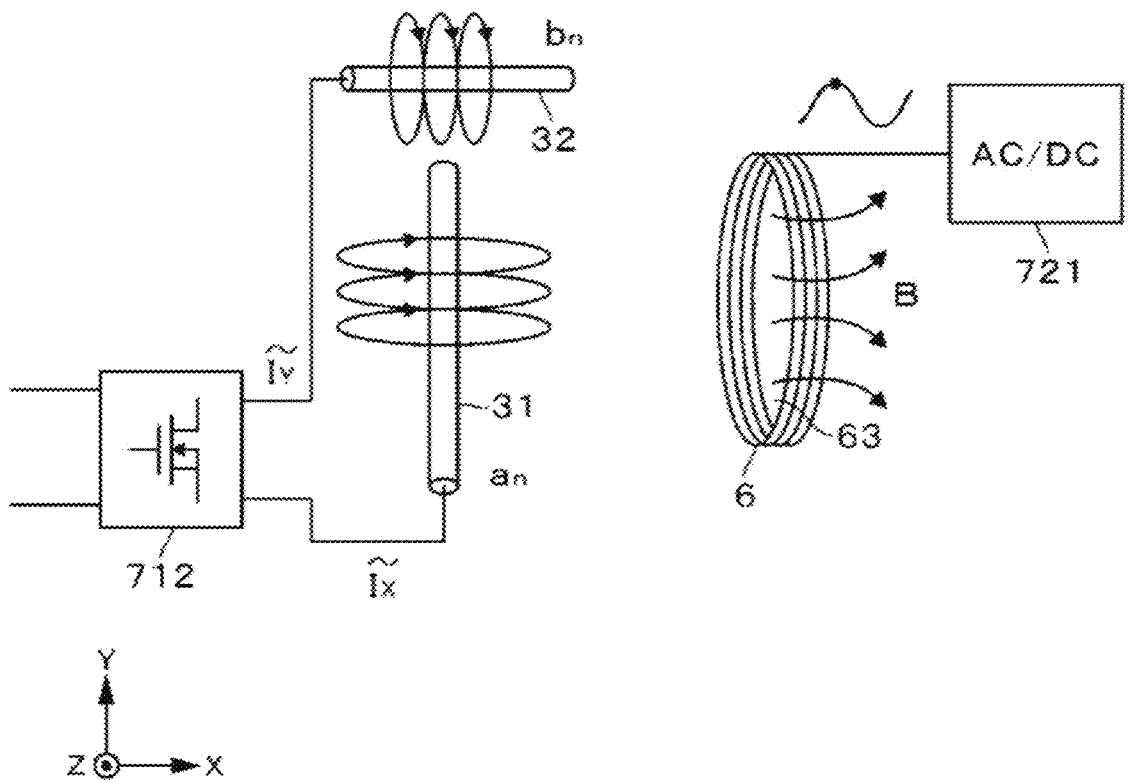
FIG. 10A is a first explanatory view for explaining the operation of the first coil and a second coil for power supply of the substrate transfer module.
Figure 10B:
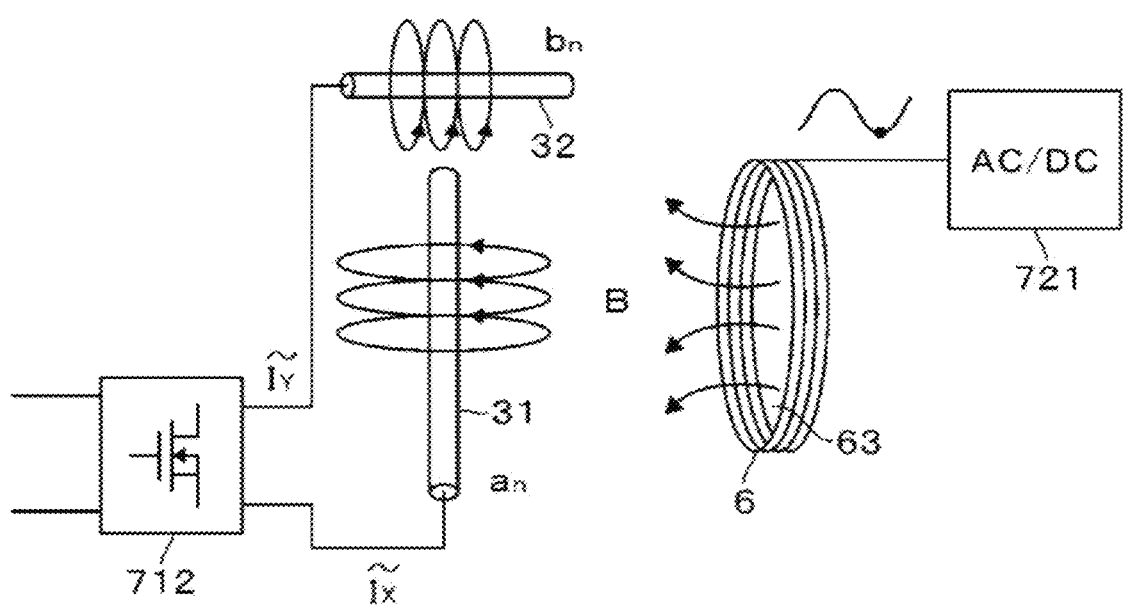
FIG. 10B is a second explanatory view for explaining the operation of the first coil and the second coil of the substrate transfer module.

FIGS. 10A and 10B show the magnetic flux B that penetrates through the opening surface 63 of the second coil 6 in the case of supplying AC powers $I_X$ and $I_Y$ to the A coil 31 and the B coil 32, respectively. In FIGS. 10A and 10B, the A coil 31 is disposed in a direction that generates the magnetic flux B. In FIGS. 10A and 10B, the directions of the AC powers supplied to the A coil 31 and the B coil 32 are different, and the directions of the magnetic flux B are different.

In the second coil 6, an electromotive force V is generated due to the change in the magnetic flux B penetrating through the opening surface 63. In the wireless power supply mode, the power supply part 34 supplies an AC power (e.g., $I_X = A_X \sin \omega t$ in the case of the A coil disposed along the X direction) to the first coils 3 of the tile part 16, and an AC power based on electromagnetic induction is also obtained on the second coil 6 side by the magnetic field that changes over time due to the above AC power.

On the other hand, while the transfer module 2 is moving, the second coil 6 moves relative to the first coils 3 of the tile part 16. Due to this movement, the magnetic flux B changes, and the electromotive force V in the second coil 6 changes.

As described above, it is preferable to suppress the change in the electromotive force V by the movement of the transfer module 2. Therefore, the power supply controller 501 controls the AC power supplied from the power supply part 34 to the first coils 3 depending on the moving speed $V_M$ at the time of performing translational movement of the transfer module 2. Specifically, the power control reduces the frequency of the AC power as the moving speed $V_M$ of the transfer module 2 increases with respect to the first coil 3 (the A coil 31 in FIGS. 10A and 10B) disposed in a direction that generates the magnetic flux B penetrating through the opening surface 63 of the second coil 6.

Hereinafter, the contents of the power control will be described.

On the assumption that the transfer module 2 moves linearly in the X direction at the moving speed $V_M$ as shown in FIG. 9, the magnetic flux B penetrating through the opening 63 of the second coil 6 is expressed by the following Eq. (1).

$$B(x,t) = A\sin(\omega t + 2\Pi V_M t / \lambda) \qquad \text{Eq. (1)}$$

Here, A is a constant, $\lambda$ is a wavelength, $\omega$ is an angular velocity ($\omega = 2\pi fsw$), and fsw is a frequency. $V_M$ and $\omega$ are originally functions that depend on time, but are defined as constants here for simplicity.

When the magnetic flux penetrating through the opening 63 of the second coil 6 per unit area is defined as $\phi$, the electromotive force V is expressed by the following Eq. (2) because $\phi$ is B.

$$V = -N \cdot d\Phi/dt = A(\omega + 2\Pi V_M/\lambda)\cos(\omega t + 2\Pi V_M t/\lambda) \qquad \text{Eq. (2)}$$

Here, N is the number of turns of the second coil.

When the relationship in the following Eq. (3) is obtained from the above Eq. (2), the electromotive force V becomes constant.

$$\omega + 2\Pi V_M/\lambda = \text{const} \qquad \text{Eq. (3)}$$

Figure 11:
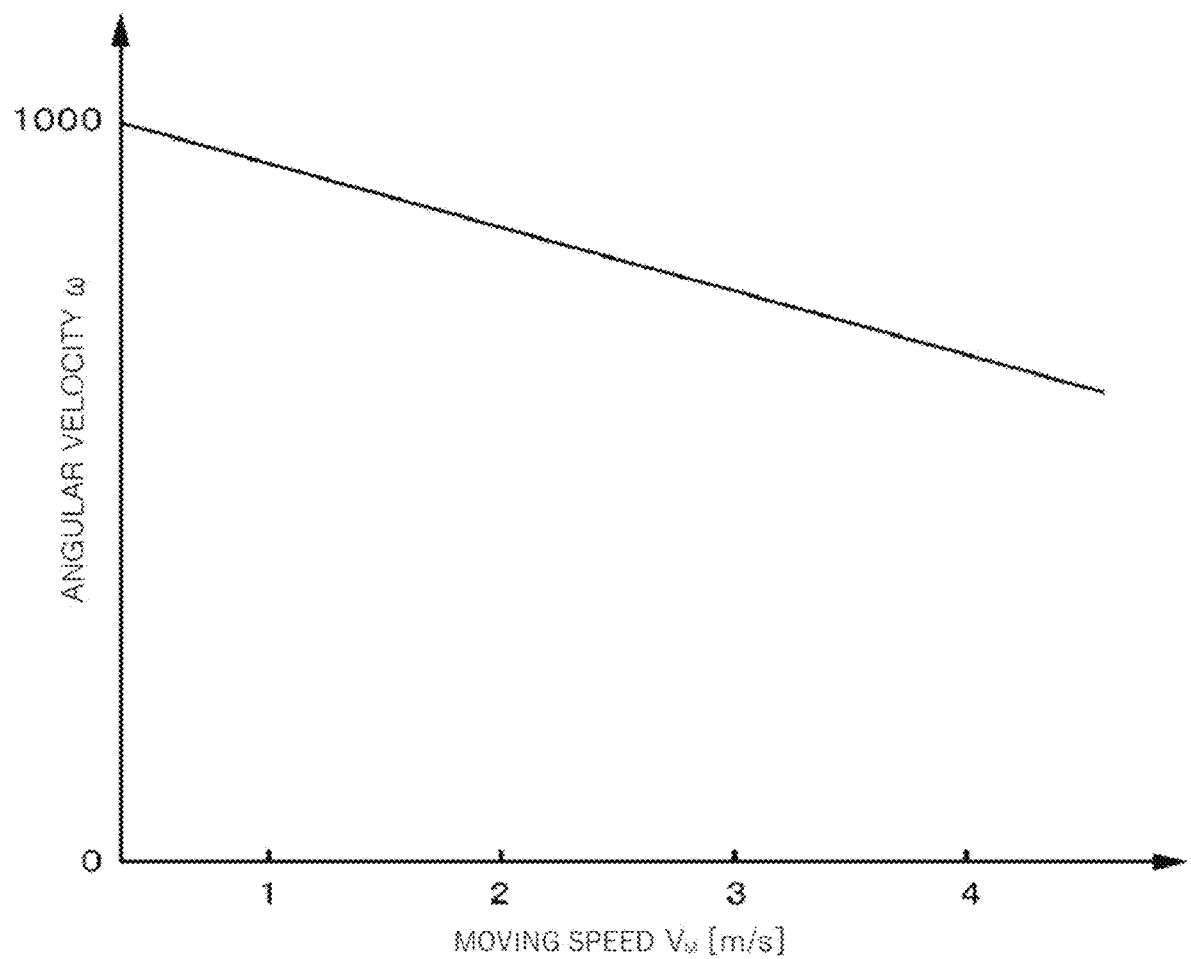
FIG. 11 is a first characteristic diagram showing relationship between an angular velocity and a movement speed of the substrate transfer module.

FIG. 11 is an example of Eq. (3) in the case where A is 0.01 and $\lambda$ is $10 \times 10^{-3}$. In FIG. 11, the horizontal axis represents the moving speed $V_M$ (m/s) of the transfer module 2, and the vertical axis represents the angular velocity $\omega$. As can be seen from FIG. 11, as the moving speed $V_M$ increases, the value of the angular velocity $\omega$ of the AC power supplied from the power supply part 34 linearly decreases. Accordingly, it is possible to make the average electromotive force (the voltage after conversion to a DC power by the AC/DC conversion circuit 721) in the second coil 6 constant (suppress variation in the electromotive force). Since the angular velocity $\omega$ is $2\pi fsw$, the power supply controller 501 decreases the frequency fsw of the AC power supplied to the A coil $a_n$ directly below the second coil 6 as the moving speed $V_M$ of the transfer module 2 increases, thereby suppressing variation in the electromotive force V.

Here, the case where the transfer module 2 that is disposed such that the fork 22 is parallel to the X direction moves in translation in the X direction has been described as an example. However, the same applies when the transfer module 2 that is disposed such that the fork 22 is parallel to the Y direction moves in translation in the Y direction. In this case, the B coil 32 is disposed in the direction that generates the magnetic flux B penetrating through the opening surface 63 of the second coil 6. The power supply controller 501 is configured to decrease the frequency of the AC power as the moving speed $V_M$ of the transfer module 2 increases in the case of supplying an AC power to the B coil 32.

Further, the transfer module 2 may move in translation in a diagonal direction or may rotate around the center point without changing the direction of the main body 21. In such movement, the frequency change control is performed for both the A coil 31 and the B coil 32 depending on the magnitude of the X-direction and Y-direction components of the moving speed $V_M$.

Further, the suppression of variation in the electromotive force indicates the suppression of variation in the electromotive force within a range that does not exceed the upper limit of the voltage of the voltage regulator 722, and the variation range of the electromotive force is set by the upper limit of the voltage. For example, it includes the case where the variation is within ±20% of the average value of the electromotive force.

<Constant Electromotive Force in Rotational Movement>

Next, the power control by the power supply controller 501 at the time of rotating the transfer module 2 around a rotation axis perpendicular to the moving surface 15 (bottom surface) in the wireless power supply mode will be described with reference to FIGS. 12 and 13.

The power supply controller 501 is configured to select the coil for wireless power supply, which is capable of generating the magnetic flux B penetrating through the opening surface 63 of the second coil 6, between the A coil 31 and the B coil 32 by the rotational movement of the transfer module 2.

Figure 12:
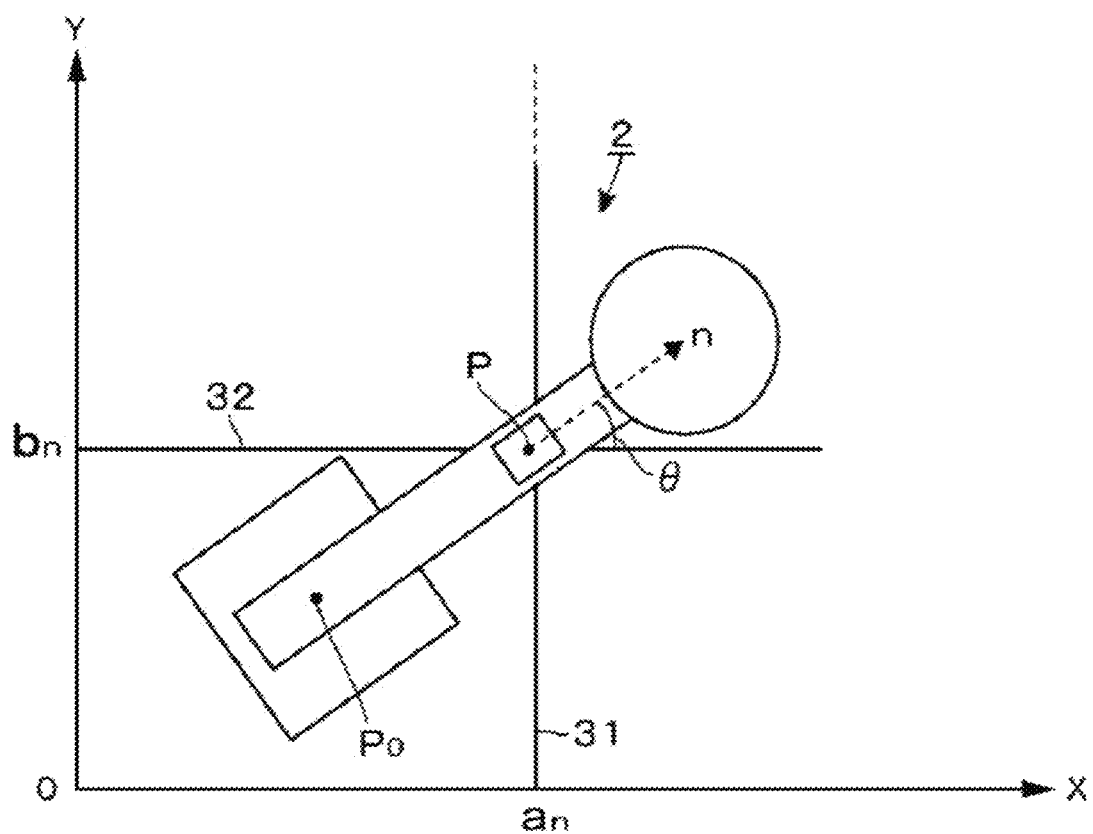
FIG. 12 is a plan view showing a rotational operation of the substrate transfer module.

FIG. 12 schematically shows a state in which the main body 21 rotates around a vertical axis centered on the position $P_0$ with respect to the X direction from a position in which the fork 22 of the transfer module 2 is parallel to the X direction. In FIG. 12, the horizontal axis represents the X direction, the vertical axis represents the Y direction, $a_n$ represents the coil wire of the A coil 31 directly below the position P of the second coil 6, and $b_n$ represents the coil wire of the B coil 32.

In FIG. 12, the coil for wireless power supply is the A coil 31, and the angle θ is formed by the direction of the magnetic flux B penetrating through the opening surface 63 of the second coil 6 (the direction indicated by the dashed arrow in FIG. 12) and the arrangement direction (the X direction in FIG. 12) of the A coil 31 for wireless power supply, as shown in FIG. 12.

As described with reference to FIGS. 3, 4, 5, and the like, the plurality of A coils 31 and the plurality of B coils 32 are provided on the moving surface 15 (the tile part 16) in different directions, for example, the X direction and the Y direction. During the rotational movement of the transfer module 2, the magnetic flux B penetrating through the opening surface 63 of the second coil 6 is affected by the magnetic fields generated by the A coils 31 and the B coils 32. In the following description, it is assumed that the powers $I_X(=A_X \sin \omega t)$ and $I_Y(=A_Y \sin \omega t)$ of a common frequency are supplied to the A coils 31 and the B coils 32, respectively.

In the transfer module 2 shown in FIG. 12, the magnetic flux B in the X, Y, and Z directions penetrating through the opening surface 63 of the second coil 6 at the rotation angle θ around the vertical axis (Z-axis) with the X direction as the reference (0°) is expressed by the following Eq. (4).

$$B = (\mu_0 A \times \sin\omega t / 2\Pi Z_0, -\mu_0 A_Y \sin\omega t / 2\Pi Z_0, 0) \qquad \text{Eq. (4)}$$

Therefore, if the unit vector normal to the opening surface 63 of the second coil 6 is defined as n=(cos θ, sin θ, 0), a magnetic flux φ penetrating through the second coil 6 is expressed by the following Eq. (5).

$$\Phi = \mu_0 \sin\omega t / 2\Pi Z_0 \cdot (A_X \cos\theta - A_Y \sin\theta) \qquad \text{Eq. (5)}$$

Therefore, the electromotive force V in the second coil 6 is expressed by the following Eq. (6).

$$V = -Nd\Phi/dt = -N \cdot \mu_0 \omega \sin\omega t / 2\Pi Z_0 \cdot (A_X \cos\theta - A_Y \sin\theta) \qquad \text{Eq. (6)}$$

When the following relationship (7) is obtained from the above Eq. (6), the electromotive force becomes constant.

$$A_X \cos\theta - A_Y \sin\theta = \text{const} \qquad \text{Eq. (7)}$$

Here, the relationship of $\cos^2 \theta + \sin^2 \theta = 1$ is obtained.

Therefore, the power control is performed such that the maximum current values of the current values $I_X(=A_X \sin \omega t)$ and $I_Y(=A_Y \sin \omega t)$ of the powers supplied to the A coils 31 and the B coils 32 become $A_X=\cos \theta$ and $A_Y=-\sin \theta$, respectively, depending on the rotation angle θ of the transfer module 2, for example.

On the other hand, during the rotational movement of the transfer module 2, the distance between the A coil 31 or the B coil 32 to which the power is being supplied in the wireless power supply mode and the magnets 4 disposed in the main body 21 may become short. In this case, it is necessary to suppress the influence of the magnetic field generated around the A coil 31/B coil 32 to which the power is being supplied in the wireless power supply mode on the operation control of the transfer module 2.

Therefore, during the rotational movement, the coil used for wireless power supply may be switched from the B coil 32/A coil 31 that become close to the magnets 4 in the main body 21 to the B coil 32/A coil 31 that become distant from the magnets 4 depending on the rotation angle θ of the transfer module 2.

Figure 13:
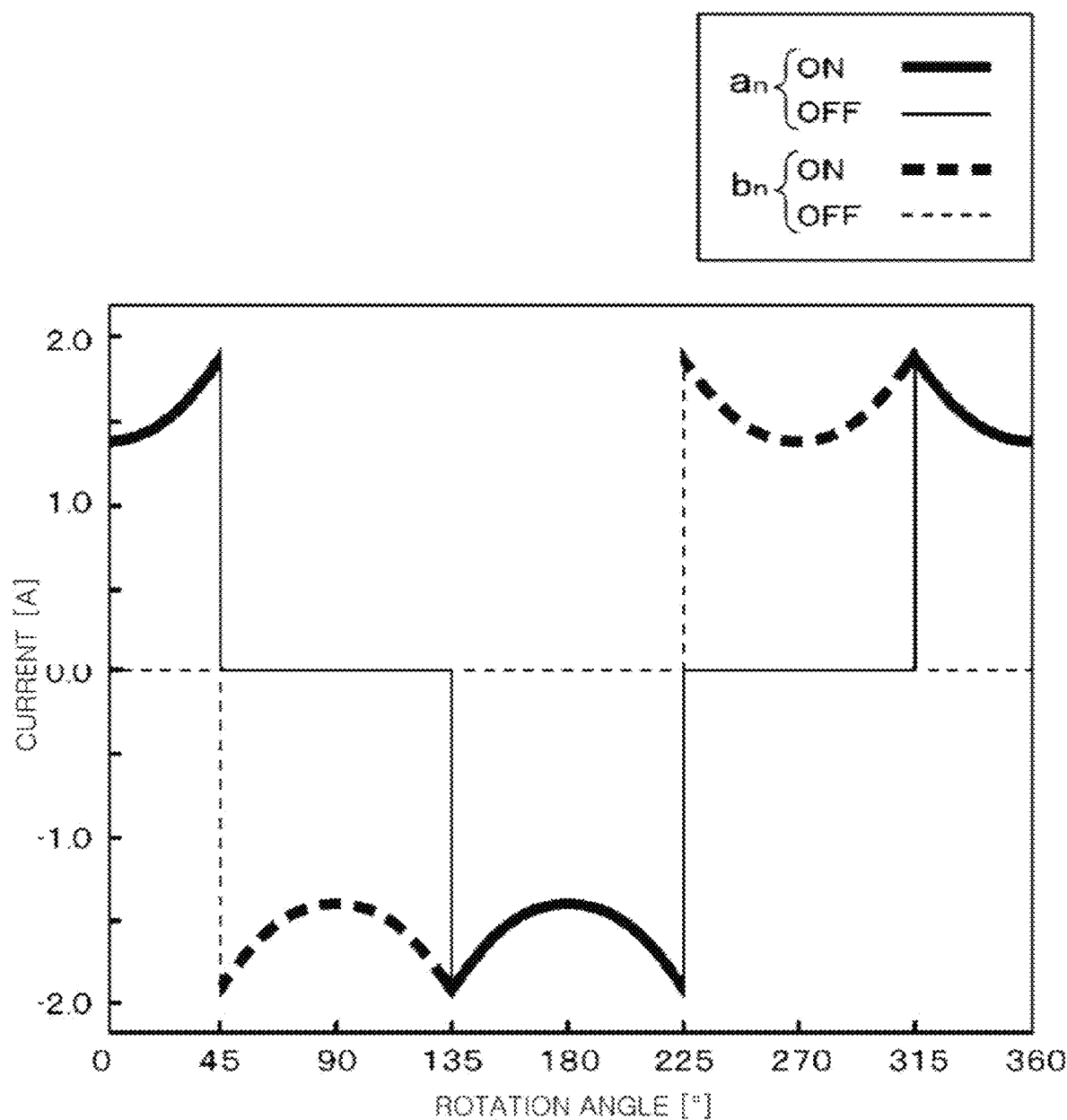
FIG. 13 is a second characteristic diagram showing an example of current control with respect to a rotation angle of the substrate transfer module.

For example, FIG. 13 shows changes in the maximum current values $A_X$ and $A_Y$ in the case of switching the A coil 31/B coil 32 used for wireless power supply at the timing at which the rotation angle (the angle θ with respect to the X direction) becomes 45°+n·90° (n=0, 1, 2, 3).

In this case, Eqs. (4) to (7) are calculated to perform the power supply control using any one of the A coil 31 and the B coil 32, and the values of the maximum current values $A_X$ and $A_Y$ are obtained. The signs of the maximum current values $A_X$ and $A_Y$ in FIG. 13 indicate the directions of the current flowing through the A coil 31 and the B coil 32. $A_X$ has a positive value in the positive direction of the Y axis, and $A_Y$ has a positive value in the positive direction of the X axis.

FIG. 13 shows an example of the selection of the A coil $a_n$ and the B coil $b_n$, which is performed to suppress variation in the electromotive force V during the rotational movement of the main body 21 shown in FIG. 12, and an example of the maximum current value of the AC power supplied to the selected A coil $a_n$ and B coil $b_n$. In FIG. 13, the horizontal axis represents the rotation angle (angle θ), and the vertical axis represents the maximum current value of the AC power. In the AC power supplied to the A coil $a_n$ and the B coil $b_n$, the power supply to the A coil an is indicated by a thick solid line when it is "ON" and by a thin solid line when it is "OFF." Further, the power supply to the B coil $b_n$ is indicated by a thick dashed line when it is "ON" and by a thin dashed line when it is "OFF."

As shown in FIG. 13, for example, at a rotation angle θ=45°+n·90° (n=an integer including 0, 1, 2, and 3), any one of the A coil 31 and the B coil 32 is selected as the coil supplying the AC power. In other words, each first coil 3 is selected such that the AC power is supplied to the A coil $a_n$ when the rotation angle is in a range of 0°≤θ<45°, to the B coil $b_n$ when the rotation angle is in a range of 45°≤θ<135°, to the coil $a_n$ when the rotation angle is in a range of 135°≤θ<225°, to the B coil $b_n$ when the rotation angle is in a range of 225°≤θ<315°, and to the coil $a_n$ when the rotation angle is in a range of) 315°≤θ<360° (0°).

Based on the results of calculating the maximum current values $A_X$ and $A_Y$, the control in which the AC power supplied to the A coil $a_n$ and the B coil $b_n$ is controlled to become close to the values $A_X$ and $A_Y$ as the rotation angle θ becomes close to 45°±n·90° (n=0, 1, 2, 3) is performed. Accordingly, the AC powers of the maximum current values $A_X$ and $A_Y$ are supplied to the A coil $a_n$ and the B coil $b_n$ at the rotation angle θ=45°+n·90° (n-integer including 0, 1, 2, 3) where the influence of the magnetic fields is minimum, thereby suppressing a decrease in the electromotive force at the corresponding positions and suppressing variation in the total electromotive force. The control example of FIG. 13 is only an example, and the magnitude of the current is appropriately set in consideration of conditions such as the arrangement of the first coils 3 and the upper limit voltage value of the voltage regulator 722.

Figure 14:
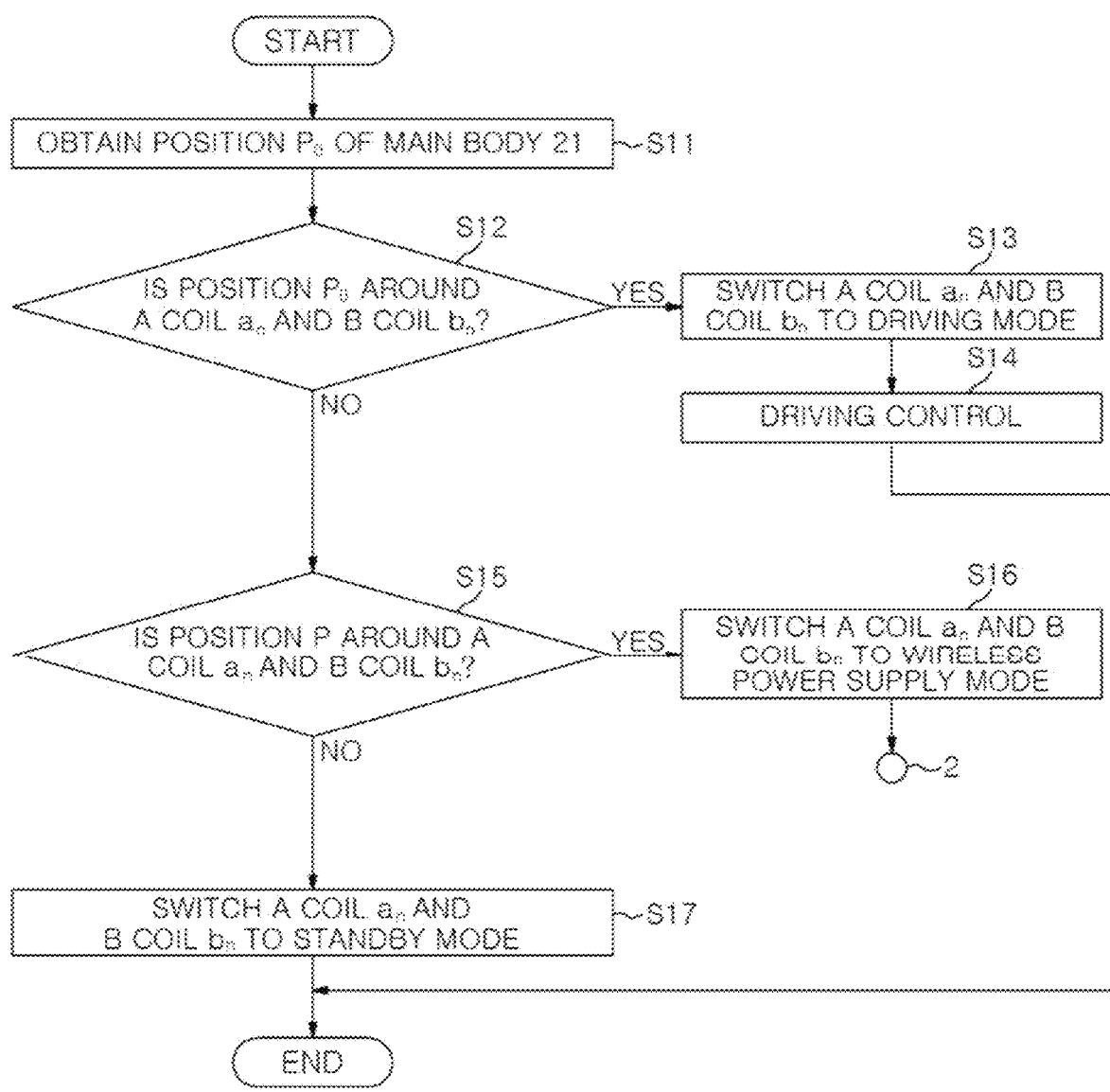
FIG. 14 is a first flowchart showing an example of power supply control of the substrate transfer module.
Figure 15:
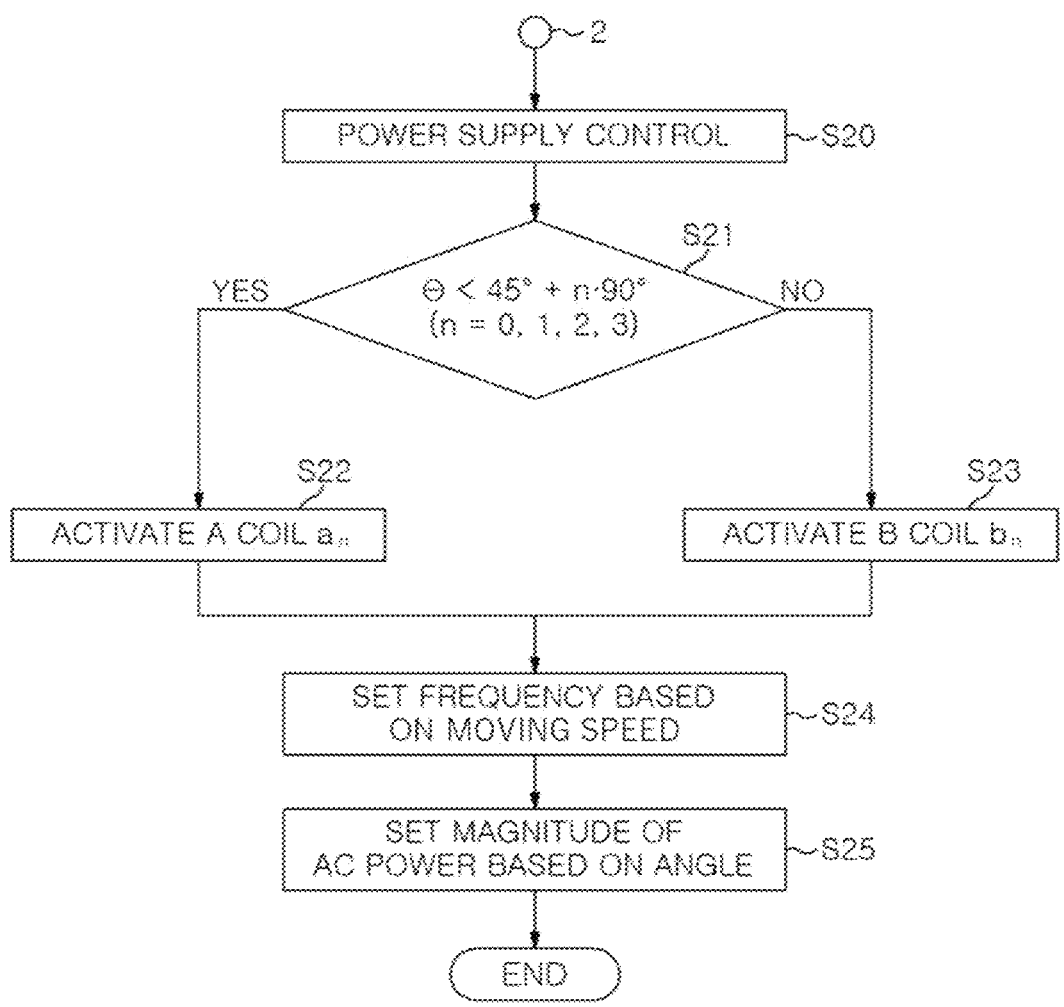
FIG. 15 is a second flowchart showing an example of power supply control of the substrate transfer module.

Next, the operation of the wireless power supply will be described with reference to the flowcharts shown in FIGS. 14 and 15.

First, the position $P_0$ of the main body 21 of the transfer module 2 is obtained (step S11). The position $P_0$ of the main body 21 is detected by the Hall element disposed at the tile part 16 as described above. Then, in step S12, it is determined whether or not the detected position $P_0$ is around the A coil $a_n$ and the B coil $b_n$, that is, whether the A coil $a_n$ and the B coil $b_n$ are directly below the main body 21. In the case of "Yes," the processing proceeds to step S13 to switch the power supply states of the A coil $a_n$ and the B coil $b_n$ to the driving mode, and the driving control of the transfer module 2 is executed (step S14).

On the other hand, in the case of "No," the processing proceeds to step S15 to determine whether or not the position P of the second coil 6 is around the A coil $a_n$ and the B coil $b_n$, that is, whether the A coil $a_n$ and the B coil $b_n$ are directly below the second coil 6. The position P of the second coil 6 is calculated based on the position $P_0$ of the main body 21, as described above. In the case of "Yes," the processing proceeds to step S16 to switch the power supply states of the A coil $a_n$ and the B coil $b_n$ to the wireless power supply mode, and the power supply control is performed (step S20). In the case of "No," the processing proceeds to step S17 to switch the power supply states of the A coil $a_n$ and the B coil $b_n$ to the standby mode (step S17).

For the power supply control, in step S21, it is determined whether or not the angle θ is less than 45°+n·90° (n=0, 1, 2, 3). In the case of "Yes," the processing proceeds to step S22 to activate the A coil $a_n$. In the case of "No," the processing proceeds to step S23 to active the B coil $b_n$. The activation means that the A coil $a_n$ (B coil $b_n$) is selected as the coil to which the AC power is supplied, and the AC power is supplied to the selected A coil $a_n$ (B coil $b_n$).

Then, in step S24, the frequency of the AC power to be supplied to the activated coil is set based on the moving speed $V_M$ of the transfer module 2. In step S25, the magnitude of the AC power to be supplied to the activated coil is set based on the angle θ of the transfer module 2. Accordingly, the AC power with the controlled frequency and the controlled magnitude is supplied to the activated A coil $a_n$ (B coil $b_n$).

In this manner, the power supply state of the first coil 3 corresponding to the position $P_0$ of the main body 21 of the transfer module 2 is switched to the driving mode, and the power supply state of the first coil 3 corresponding to the position P of the second coil 6 is switched to the wireless power supply mode, and they are driven in the driving mode and the wireless power supply mode, respectively.

In accordance with the present embodiment, by using the electromotive force acting between the second coil 6 disposed at the transfer module 2 and the magnetic field generated by the first coils 3 of the tile part 16, the power can be wirelessly supplied to the power consumption device disposed in the transfer module 2. Therefore, since the power supply state of the first coils 3 of the existing tile part 16 is controlled by providing the second coil 6 in the transfer module 2, the wireless power supply can be performed by changing the software without changing hardware.

Further, the power can be wirelessly supplied to the power consumption device while the transfer module 2 is moving above the moving surface 15. Therefore, it is possible to detect the free movement of the transfer module 2 in the X, Y, Z, and θ directions, and also possible to perform the wireless power supply in real time in the moving area of the transfer module 2.

Further, in the first coils 3 of the tile part 16, the power supply state of the first coils 3 corresponding to the positions of the magnets 4 of the transfer module 2 are switched to the driving mode, the power supply state of the first coil 3 corresponding to the position of the second coil 6 is switched to the wireless power supply mode, and the power supply state of the other first coils 3 is switched to the standby mode for the other first coils 3. The coils are arranged in the tile part 16 to cover the entire movable range of the transfer module 2, and only the first coils 3 directly below the main body 21 are used for levitating and moving the transfer module 2.

Therefore, there is no need to provide a new coil for wireless power supply, and the movement of the transfer module 2 and the wireless power supply can be performed simultaneously using the existing tile part 16. Since both the transfer operation for the wafer W by the transfer module 2 and the wireless power supply can be achieved, the power can be supplied while suppressing a decrease in the throughput.

Further, the second coil 6 and the magnets 4 disposed at the main body 21 are arranged without overlapping each other when viewed from the moving surface 15. Therefore, the driving of the main body 21 using the magnets 4 and the wireless power supply using the second coil 6 can be performed independently while suppressing mutual interference.

Further, in the case of supplying an AC power to the first coils 3 of the tile part 16, the frequency is controlled depending on the moving speed of the transfer module 2. Accordingly, even if the moving speed changes during the translational movement of the transfer module 2, the variation in the electromotive force is suppressed. In addition, the magnitude of the AC power is controlled depending on the rotation angle of the transfer module 2. Hence, the variation in the electromotive force is also suppressed during the rotational movement of the transfer module 2. Accordingly, the power can be transmitted in a state where the variation in the electromotive force is suppressed at any location in the moving area of the transfer module 2, and the wirelessly power supply with high stability can be performed in real time during the movement of the transfer module 2.

Even in the case of providing the battery 52 that stores the power supplied through the second coil 6, the battery 52 stores the power of the sensor 51 in the above embodiment. Therefore, there is no need to provide a large-capacity battery, and a small and lightweight battery 52 can be used. Hence, even if the battery 52 is disposed at the transfer module 2, the movement performance of the transfer module 2 is unlikely to be affected.

<Another Example of Second Coil>

Figure 16:
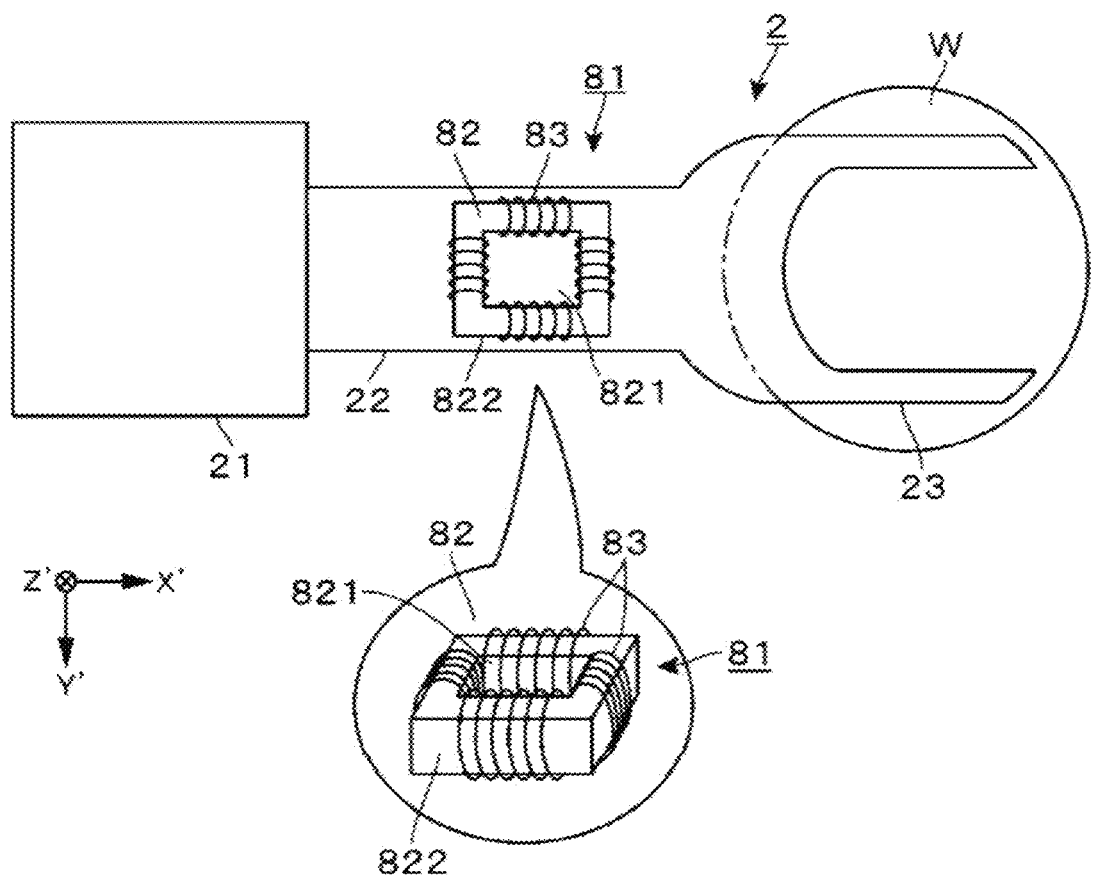
FIG. 16 is a bottom view showing another example of the substrate transfer module.
Figure 17:
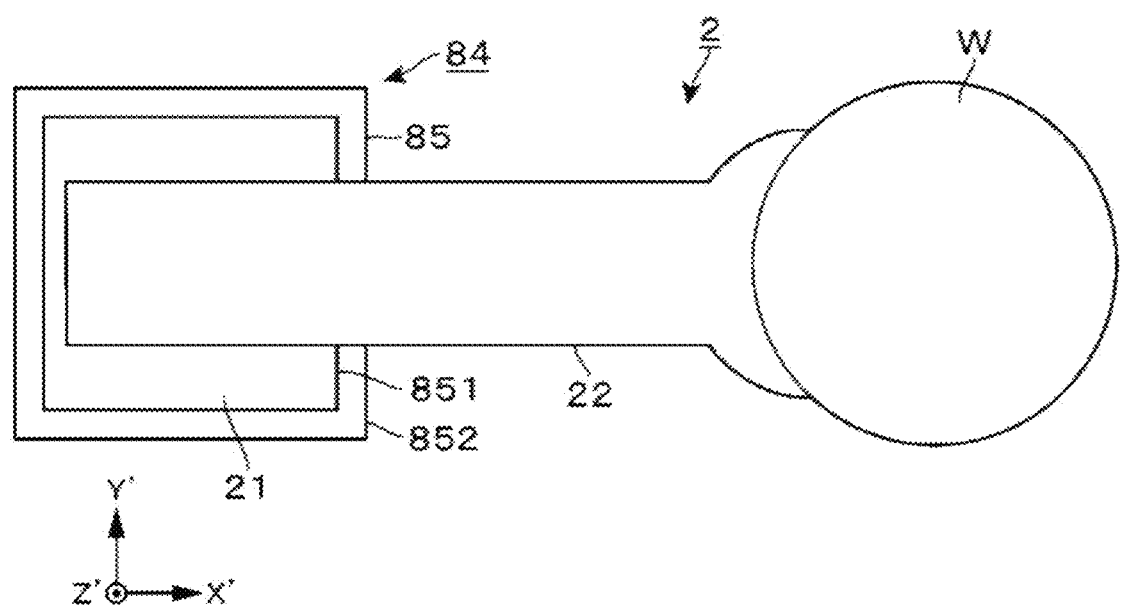
FIG. 17 is a plan view showing still another example of the substrate transfer module.

Next, another example of the second coil will be described with reference to FIGS. 16 and 17. As shown in FIGS. 16 and 17, the shape and installation position of the second coil can be set arbitrarily.

FIG. 16 shows the bottom view of the transfer module 2. In this example, the second coil 81 is disposed on the bottom surface of the fork 22 to be close to the substrate holder 23, and the base 82 is formed of a member having a rectangular ring shape in plan view. A coil wire 83 is wound between an opening 821 and an outer wall 822 of the base 82, and the opening surface of the second coil 81 faces the circumferential direction of the base 82. The coil wire 83 may be wound in the circumferential direction along the outer wall 822 of the base 82. In this case, the opening surface of the second coil 81 faces the Z' direction.

FIG. 17 shows a plan view of the transfer module 2, and shows an example in which the second coil 84 is disposed at the main body 21. In this example, the base 85 of the second coil 84 surrounds the sidewall of the main body 21, and is formed of a member having a rectangular ring shape in plan view. A coil wire (not shown) may be wound between the opening 851 and the outer wall 852 of the base 85, similarly to the second coil 81 shown in FIG. 16, or may be wound in the circumferential direction along the outer wall of the base 85.

In these examples, the second coils 81 and 84 are arranged without overlapping the magnets 4 disposed at the main body 21 when viewed from the moving surface 15. Therefore, by switching the power supply state for each of the first coils 3 disposed at the tile part 16 to the driving mode, the wireless power supply mode, and the standby mode, the movement of the transfer module 2 and the wireless power supply to the sensors 51 disposed at the transfer module 2 can be performed.

<Another Example of First Coil>

Further, the first coil disposed at the tile part 16 is not limited to the above example. For example, a plurality of coils arranged in the tile part 16 to extend in different directions along the moving surface 15 when viewed from the vertical axis intersecting with the moving surface 15 may have the configuration shown in FIG. 18.

Figure 18:
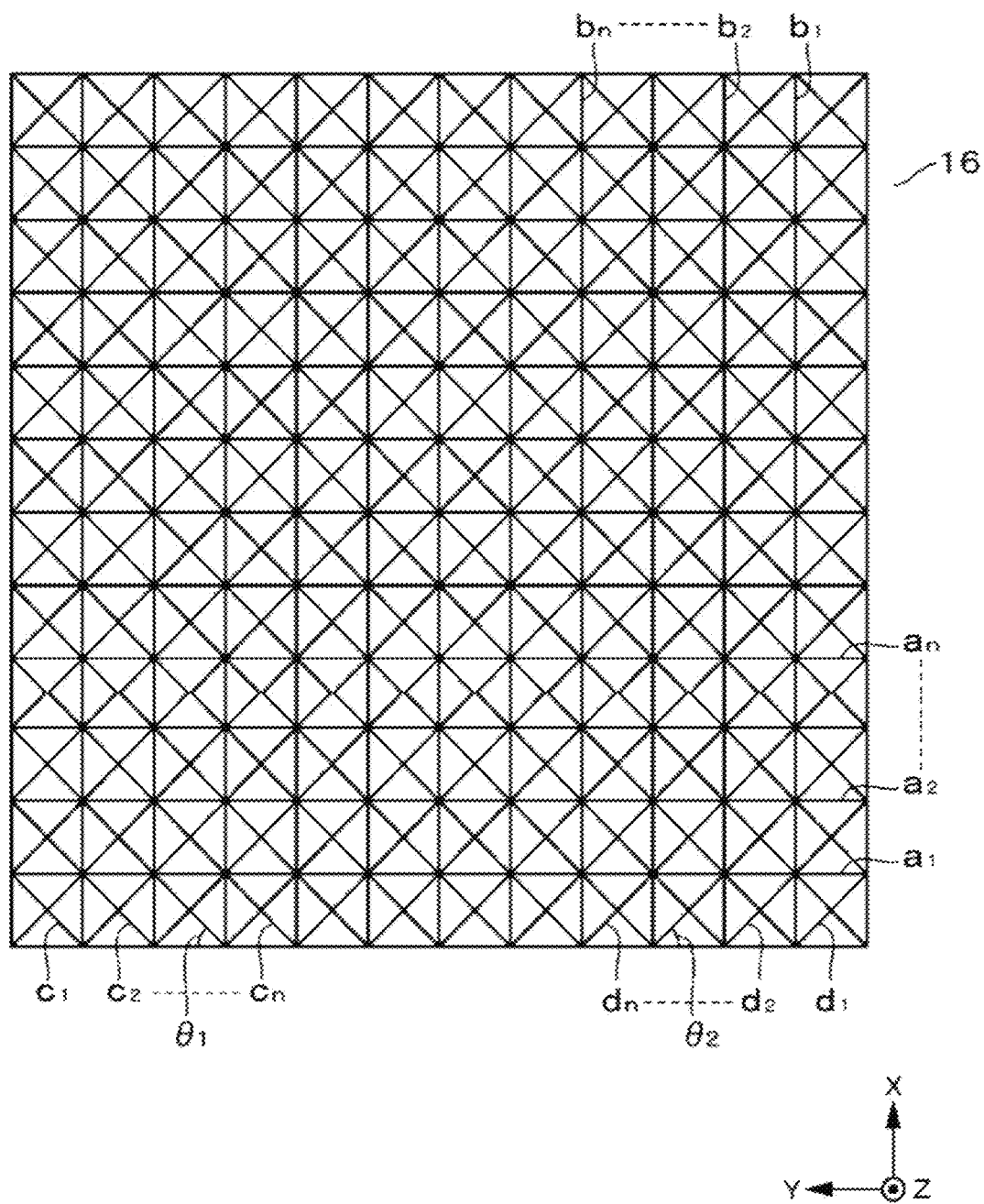
FIG. 18 is a plan view showing another example of the first coil.

The tile part 16 in the example shown in FIG. 18 includes C coils and D coils in addition to the A coils 31 ($a_1$, $a_2$, ..., $a_n$) and the B coils 32 ($b_1$, $b_2$, ..., $b_n$) described above. The C coils ($c_1$, $c_2$, ..., $c_n$) are arranged along the Y direction and formed to extend in the direction of an angle θ1 with respect to the Y direction, and the D coils ($d_1$, $d_2$, ..., $d_n$) are arranged along the Y direction and formed to extend in the direction of an angle θ2 with respect to the Y direction. In the example shown in FIG. 18, the angles θ1 and θ2 are both set to 45°.

In this example, the transfer module 2 can wirelessly supply a power to the power consuming devices disposed at the transfer module 2 by using the electromotive force that exerts against the magnetic field generated by the A coils, the B coils, the C coils, and the D coils disposed at the tile part 16.

Figure 19:
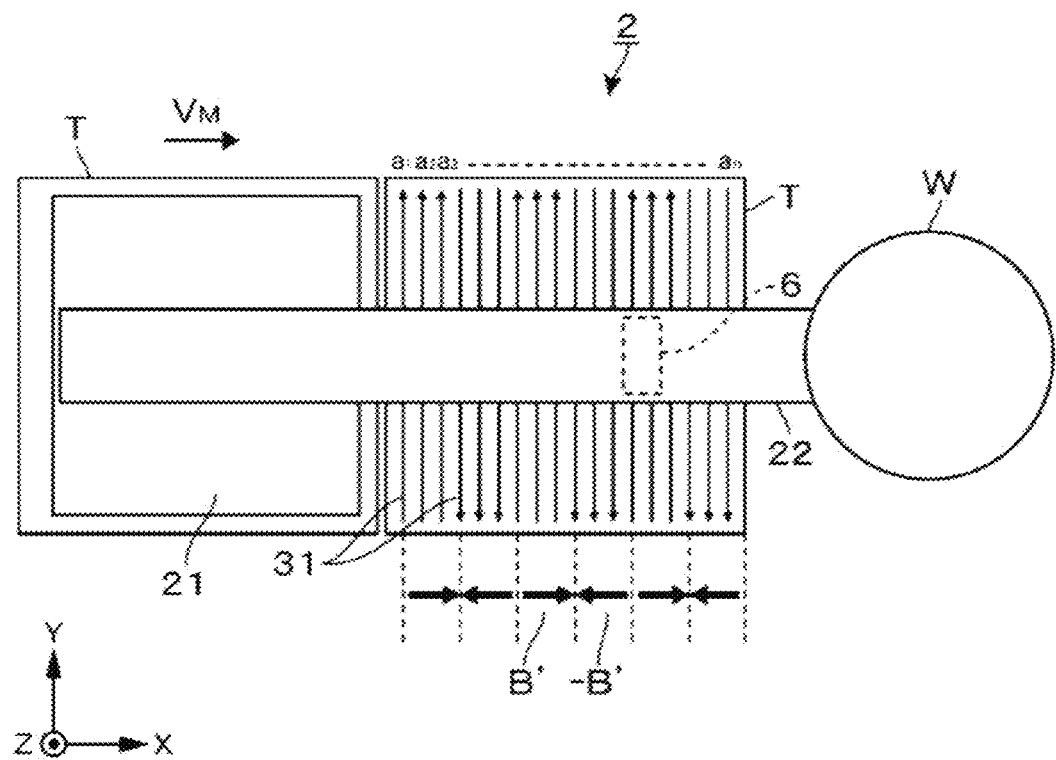
FIG. 19 is a plan view showing still another example of the first coil.

Further, in the wireless power supply mode, the power supplied to the first coils 3 disposed at the tile part 16 may be a DC power as well as an AC power. FIG. 19 shows a case of setting the power supply state of the A coils 31 ($a_1$, $a_2$, ..., $a_n$) to the wireless power supply mode when the fork 22 of the transfer module 2 configured as shown in FIG. 2 is disposed in parallel to the X direction and moves in translation in the X direction.

In this configuration, a group 1 in which a current of the $I_X$ direction is supplied to multiple coils and a group 2 in which a current of the $-I_X$ direction is supplied to multiple coils are set for the A coils 31, for example. The groups 1 and 2 are arranged alternately in the X direction.

When the transfer module 2 is moved in translation in the X direction at the moving speed $V_M$, the direction of the magnetic flux B penetrating through the second coil 6 when the second coil 6 passes through the area of the group 1 and that when the second coil 6 passed through the area of the group 2 are different, as shown by the arrows in FIG. 19. Therefore, the magnetic flux changes between the second coil 6 and the first coils 3 of the tile part 16 due to the movement of the transfer module 2, and an electromotive force is obtained. Accordingly, even in the case of supplying a DC power to the first coil 3 of the tile part 16, the wireless power supply to the transfer module 2 can be performed.

As described above, in the present disclosure, a driving coil for driving the transfer module 2, which serves as the first coil 3 disposed at the tile part 16, and a second coil for wireless power supply may be separately provided at the tile part 16. In this case, it is not necessary to switch the power supply state of the first coils 3 to the driving mode, the wireless power supply mode, or the standby mode, so that the control becomes easy.

The power consuming devices provided in the transfer module 2 may be a camera or an electromagnet, if the magnet disposed at the main body 21 is an electromagnet, in addition to various sensors 51 such as the position sensor 511 and the inclination sensor 512 as described above.

Further, it is not necessary to provide the battery 52 in the transfer module 2, and the electromotive force obtained in the second coil 6 may be converted into a DC power by the AC/DC conversion circuit 721 and then directly supplied to the sensors 51.

When the battery 52 is provided, the electromotive force obtained in the second coil 6 can be stored. Thus, when the transfer module 2 is moving above the moving surface 15, it is not necessary to set the power supply state of the first coils 3 of the tile part 16 corresponding to the second coil 6 to the wireless power supply mode. For example, when a large amount of power is stored in the battery 52, the sensors 51 may be driven by the power supplied from the battery 52 without wirelessly supplying a power to the second coil.

As described above, when an AC power is supplied to the first coils 3, an AC electromotive force acts between the first coils 3 and the second coil 6. Therefore, an electromotive force is generated not only when the transfer module 2 is moving above the moving surface 15, but also when the transfer module 2 is stopped. Hence, when the battery 52 is provided, the electromotive force obtained by the second coil 6 may be stored when the transfer module 2 is stopped, for example, when the transfer module 2 stands by for the transfer of the wafer W. Further, while the transfer module 2 is moving to transfer the wafer W, the sensors 51 may be driven by the power supplied from the battery 52 without wirelessly supplying a power to the second coil 6.

Further, the coil disposed at the tile part 16 is not limited to the above example, and may vary as long as the magnetic field can be generated at the moving surface 15 of the substrate transfer chamber 14 by power supply. For example, a coil wound in a spiral shape around a vertical axis may be used, for example.

Although an example in which addresses are assigned to the tile units T constituting the tile part 16, and a common address between the tile units T is assigned to the A coils 31 and the B coils 32 in the tile unit T has been described, the present disclosure is not limited to this example, and different coil addresses are assigned to all the A coils 31 and the B coils 32 arranged on the entire moving surface 15 of the substrate transfer chamber 14 and the coils to be set to the respective modes in the power supply state may be selected based on the coil addresses.

Further, the substrate processing chamber 11 does not necessarily process a wafer in a vacuum atmosphere, and may process a wafer in an atmospheric pressure atmosphere. Therefore, the substrate transfer chamber 14 may be maintained in an atmospheric pressure atmosphere.

Further, the main body 21 of the transfer module 2 does not necessarily have a rectangular shape in plan view, and may have a circular shape in plan view.

It should be noted that the embodiments of the present disclosure are considered to be illustrative in all respects and not restrictive. The above-described embodiments may be omitted, replaced, or changed in various forms without departing from the scope of the appended claims and the gist thereof.

The invention claimed is:

1. A substrate transfer device comprising:
a tile part forming a moving surface of an area where a substrate is transferred and provided with a plurality of first coils that generate magnetic field on the moving surface by a power supplied from a power supply part; and
a substrate transfer module including a plurality of magnets that exert a repulsive force against the magnetic field and a substrate holder configured to hold a substrate to be transferred, the substrate transfer module configured to move above the moving surface by magnetic levitation using the repulsive force,
wherein the substrate transfer module includes a second coil for wirelessly supplying a power to a power consuming device provided in the substrate transfer module during movement above the moving surface using an electromotive force that is exerted against the magnetic field generated by the first coils.

2. The device of claim 1, wherein the magnet and the second coil are arranged without overlapping each other when viewed from the moving surface, and
the apparatus further comprising:
a power supply controller configured to switch, for each of the plurality of first coils disposed at the tile part, a supplying state of the power supplied from the power supply part between a driving mode for moving the substrate transfer module, a wireless power supply mode for supplying a power to the second coil, and a standby mode in which no power is supplied, depending on the position of the second coil and the positions of the magnets of the substrate transfer module moving above the moving surface.

3. The device of claim 2, wherein the power supply part is configured to supply an AC power to the plurality of first coils, and
in the wireless power supply mode, the power supply controller controls the power supply part to decrease a frequency of the AC power as a moving speed of the substrate transfer module increases with respect to a coil, which is arranged in a direction that generates a magnetic flux penetrating through an opening surface of the second coil, among the plurality of first coils in order to suppress variation in the electromotive force.

4. The device of claim 2, wherein the tile is provided with the plurality of first coils arranged to extend in different directions along the moving surface when viewed from a vertical axis intersecting with the moving surface,
the power supply part is configured to supply the AC power to the plurality of first coils, and
in the wireless power supply mode, the power supply controller controls the power supply part to change a maximum current value of the AC power supplied to a coil, which is arranged to extend in one direction, among the plurality of first coils or the plurality of first coils arranged to extend in different directions in response to rotational movement of the substrate transfer module around the vertical axis in order to suppress variation in the electromotive force.

5. The device according to claim 2, wherein the tile is provided with the plurality of first coils arranged to extend in different directions along the moving surface when viewed from the vertical axis intersecting with the moving surface,
the power supply part is configured to supply the AC power to the plurality of first coils, and
in the wireless power supply mode, the power supply controller controls to switch the supplying state of the power supplied to a coil, which is arranged to extend in a direction that becomes close to the magnet of the substrate transfer module, among the plurality of first coils to a mode other than the wireless power supply mode, and switch the supplying state of the power supplied to another coil, which is arranged to extend in a direction that becomes distant from the magnet, among the plurality of first coils to the wireless power supply mode, in response to the rotational movement of the substrate transfer module around the vertical axis in order to avoid influence of magnetic field generated at the second coil on a moving operation of the substrate transfer module.

6. The device according to claim 1, wherein the substrate transfer module includes:
a main body provided with the magnet; and
a fork disposed to extend in a direction along the moving surface from the main body and having the substrate holder at a tip end thereof,
wherein the second coil is disposed at the fork.

7. The device of claim 1, wherein the substrate transfer module includes a battery that stores the power supplied through the second coil and supplies the power to the power consuming device.

8. The device of claim 7, wherein the substrate transfer module includes:
an AC/DC conversion circuit disposed between the second coil and the battery and configured to convert the AC power supplied through the second coil into a DC power; and
a voltage regulator configured to adjust a voltage of the DC power converted by the AC/DC conversion circuit.

9. The device of claim 1, wherein the power consuming device is a sensor disposed at the substrate transfer module.

10. A power supply method for a device for transferring a substrate, comprising:
moving a substrate transfer module above a moving surface of an area where the substrate is transferred by magnetic levitation using a repulsive force, by using a tile part forming the moving surface and provided with a plurality of first coils that generate magnetic field at the moving surface by a power supplied from a power supply part, and by using the substrate transfer module including a plurality of magnets that exert the repulsive force against the magnetic field, and a substrate holder configured to hold the substrate to be transferred; and
wirelessly supplying a power to a power consuming device provided in the substrate transfer module using a second coil for power supply disposed at the substrate transfer module during said moving the substrate transfer module above the moving surface using an electromotive force acting between the magnetic field generated by the first coils and the second coil.

11. The method of claim 10, wherein in the substrate transfer module, the magnets and the second coil are arranged without overlapping each other when viewed from the moving surface, and
the method further comprising:
switching, for each of the first coils disposed at the tile part, a supplying state of the power supplied from the power supply part between a driving mode for moving the substrate transfer module, a wireless power supply mode for supplying a power to the second coil, and a standby mode in which no power is supplied, depending on the position of the second coil and the positions of the magnets of the transfer module during said moving the substrate transfer module above the moving surface.

12. The method of claim 11, wherein the power supply part is configured to supply an AC power to the plurality of first coils, and
in said switching the power supply state from the power supply part, the frequency of the AC power is controlled to decrease as the moving speed of the substrate transfer module increases with respect to a coil, which is arranged in a direction that generates a magnetic flux penetrating through the opening surface of the second coil, among the plurality of first coils in order to suppress variation in the electromotive force in the wireless power supply mode.

13. The method of claim 11, wherein the tile is provided with a plurality of first coils arranged to extend in different directions along the moving surface when viewed from a vertical axis intersecting with the moving surface,
the power supply part is configured to supply an AC power to the plurality of first coils, and
in said switching the power supply state from the power supply part, in the wireless power supply mode, a maximum current value of the AC power is controlled to change in order to suppress variation in the electromotive force for a coil, which is arranged to extend in one direction, among the plurality of first coils or the plurality of first coils arranged to extend in different directions in response to the rotational movement of the substrate transfer module around the vertical axis.

14. The method of claim 11, wherein the tile is provided with a plurality of first coils arranged to extend in different directions along the moving surface when viewed from a vertical axis intersecting with the moving surface, and
in said switching the power supply state from the power supply part, the supplying state of the power supplied to a coil, which is arranged to extend in a direction that becomes close to the magnet of the substrate transfer module, among the plurality of first coils is switched to a mode other than the wireless power supply mode and the supplying state of the power supplied to another coil, which is arranged to extend in a direction that becomes distant from the magnet, among the plurality of first coils is switched to the wireless power supply mode in response to the rotational movement of the substrate transfer module around the vertical axis in order to avoid influence of magnetic field generated at the second coil controlled to the wireless power supply mode on a moving operation of the substrate transfer module.

* * * * *